(12) United States Patent
Miwa et al.

(10) Patent No.: US 11,996,418 B2
(45) Date of Patent: May 28, 2024

(54) DISPLAY DEVICE AND MANUFACTURING METHOD

(71) Applicant: SHARP KABUSHIKI KAISHA, Sakai (JP)

(72) Inventors: Masahiko Miwa, Sakai (JP); Takao Saitoh, Sakai (JP); Masaki Yamanaka, Sakai (JP); Yi Sun, Sakai (JP); Yohsuke Kanzaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 370 days.

(21) Appl. No.: 17/600,077

(22) PCT Filed: Apr. 9, 2019

(86) PCT No.: PCT/JP2019/015452
§ 371 (c)(1),
(2) Date: Sep. 29, 2021

(87) PCT Pub. No.: WO2020/208704
PCT Pub. Date: Oct. 15, 2020

(65) Prior Publication Data
US 2022/0190002 A1    Jun. 16, 2022

(51) Int. Cl.
*H01L 27/14*    (2006.01)
*H01L 27/12*    (2006.01)
*H10K 59/124*    (2023.01)

(52) U.S. Cl.
CPC ...... *H01L 27/1248* (2013.01); *H01L 27/1255* (2013.01); *H01L 27/127* (2013.01); *H10K 59/124* (2023.02)

(58) Field of Classification Search
CPC ............. H01L 27/1248; H01L 27/1255; H01L 27/127; H01L 27/124; H10K 59/124;
(Continued)

(56) References Cited

U.S. PATENT DOCUMENTS 8,932,682 B2 *  1/2015  Arai ...................... C23C 14/246
                                                         118/727
9,466,652 B2 * 10/2016  Kim .................... H01L 27/1255
(Continued)

FOREIGN PATENT DOCUMENTS

JP    2001-250949 A    9/2001
JP    2017-173505 A    9/2017

*Primary Examiner* — Tan N Tran
(74) *Attorney, Agent, or Firm* — ScienBiziP, P.C.

(57) ABSTRACT

A display device includes a substrate; a semiconductor layer; a gate insulating film; a gate electrode; a first interlayer insulating film; a capacitance electrode; and a second interlayer insulating film. Each of a pixel circuits includes a drive transistor, a capacitor and a connection wiring line. The capacitance electrode is provided with a first opening and a second opening in portions of positions overlapping with the gate electrode in plan view. The first interlayer insulating film and the second interlayer insulating film include a contact hole provided at a position surrounded by the first opening and a hole provided at a position surrounded by the second opening. The connection wiring line is provided on the second interlayer insulating film and is connected to the gate electrode via the contact hole. The hole overlaps with a portion of a channel region in plan view.

4 Claims, 39 Drawing Sheets

(58) Field of Classification Search
CPC ........... H10K 59/1213; H10K 59/1216; H10K 59/131; H05B 33/02; H05B 33/10
USPC .................................................. 257/59, 72
See application file for complete search history.

(56) References Cited

U.S. PATENT DOCUMENTS

| | | |
|---|---|---|
| 2017/0005156 A1 | 1/2017 | Kim et al. |
| 2017/0124953 A1 | 5/2017 | Shim |
| 2017/0278916 A1 | 9/2017 | Maruyama |
| 2017/0330927 A1 | 11/2017 | Lee et al. |
| 2019/0165071 A1 | 5/2019 | Maruyama |
| 2021/0083029 A1 | 3/2021 | Maruyama |

* cited by examiner

DISPLAY DEVICE AND MANUFACTURING METHOD

TECHNICAL FIELD

The disclosure relates to a display device including pixel circuits and a manufacturing method of a display device.

BACKGROUND ART

In recent years, along with advances in Organic Light Emitting Diode (OLED) technology, products provided with organic Electro Luminescence (EL) display devices have become widespread. In general, in an organic EL display device, a configuration including a plurality of pixel circuits that supplies a current to pixels in a light-emitting layer is used.

The pixel circuit is typically configured by a combination of a plurality of transistors, and appropriately selects a pixel to be emitted in accordance with an input signal. In the transistor, a threshold voltage is an important factor and various approaches have been proposed to control the threshold voltage (for example, see PTL 1).

In addition, although the transistor uses various materials such as polysilicon and an oxide semiconductor, there is difference in characteristics such as drive capability depending on the materials and a manufacturing method. In view of this, a method has been proposed in which transistors using different materials are mounted together with a high drive capability (for example, see PTL 2).

CITATION LIST

Patent Literature

PTL 1: JP 2001-250949 A
PTL 4-2: JP 2017-173505 A

SUMMARY

Technical Problem

The semiconductor device disclosed in PTL 1 includes a TFT in which an electrode, a first insulating layer, an active layer, and a second insulating layer are sequentially formed on an insulating surface, the active layer has tensile stress and the second insulating layer has compressive stress. In this semiconductor device, a configuration in which two TFTs are provided is illustrated, but since the stress is affected by a film thickness or the like, the structure of the TFTs is limited in some cases.

The display device disclosed in PTL 2 includes a plurality of pixel electrodes provided in a display region, a common electrode disposed above the plurality of pixel electrode, a self-light-emitting element layer interposed between the pixel electrode and the common electrode, and a circuit layer provided in a peripheral region. The circuit layer is provided with a first thin film transistor formed using low-temperature polysilicon and a second thin film transistor formed using an oxide semiconductor, and the second thin film transistor is located at a layer position above the first thin film transistor. In this display device, there is a problem in that a variety of layers are layered in order to mount transistors using different materials together, so that a manufacturing flow is complicated.

The disclosure has been made to solve the above problem, and an object of the disclosure is to provide a display device including a transistor having characteristics according to applications.

Solution to Problem

A display device according to the disclosure is a display device including a plurality of pixels and pixel circuits corresponding to the plurality of pixels, including a substrate, a semiconductor layer, a gate insulating film, a gate electrode, a first interlayer insulating film, a capacitance electrode, and a second interlayer insulating film, the semiconductor layer, the gate insulating film, the gate electrode, the first interlayer insulating film, the capacitance electrode, and the second interlayer insulating film being sequentially layered on the substrate, in which each of the pixel circuits including a drive transistor, a capacitor and a connection wiring line, the drive transistor including the semiconductor layer, the gate insulating film, and the gate electrode overlapping with each other in plan view, the capacitor including the gate electrode, the first interlayer insulating film, and the capacitance electrode overlapping with each other in plan view, the semiconductor layer being provided with a channel region and conductor regions sandwiching the channel region therebetween, the capacitance electrode being provided with a first opening and a second opening in portions of positions overlapping with the gate electrode in plan view, the first interlayer insulating film and the second interlayer insulating film including a contact hole provided at a position surrounded by the first opening and a hole provided at a position surrounded by the second opening, the connection wiring line being provided on the second interlayer insulating film and being connected to the gate electrode via the contact hole, and the hole overlapping with a portion of the channel region in plan view.

In the display device according to the disclosure, the hole may be configured to be provided to intersect at least one end of the channel region in a channel width direction orthogonal to a channel length direction in which the conductor regions face each other.

In the display device according to the disclosure, the hole may be configured to be provided to intersect both ends of the channel region in the channel width direction.

The display device according to the disclosure may be configured such that a plurality of the second openings and a plurality of the holes corresponding to the plurality of second openings are provided.

In the display device according to the disclosure, the contact hole may be configured to overlap with a portion of the channel region in plan view.

A display device according to the disclosure is a display device including a plurality of pixels and pixel circuits corresponding to the plurality of pixels, including a substrate, a semiconductor layer, a gate insulating film, a gate electrode, a first interlayer insulating film, a capacitance electrode, and a second interlayer insulating film, the semiconductor layer, the gate insulating film, the gate electrode, the first interlayer insulating film, the capacitance electrode, and the second interlayer insulating film being sequentially layered on the substrate, in which each of the pixel circuits including a drive transistor, a capacitor and a connection wiring line, the drive transistor including the semiconductor layer, the gate insulating film, and the gate electrode overlapping with each other in plan view, the capacitor including the gate electrode, the first interlayer insulating film, and the capacitance electrode overlapping with each other in plan view, the semiconductor layer being provided with a channel region and conductor regions sandwiching the channel region therebetween, the capacitance electrode being provided with a first opening in portions of positions overlapping with the gate electrode in a plan view, the first interlayer insulating film and the second interlayer insulating film including a contact hole provided at a position surrounded by the first opening, the connection wiring line being provided on the second interlayer insulating film and being connected to the gate electrode via the contact hole, and the contact hole overlapping with a portion of the channel region in a plan view.

In the display device according to the disclosure, the contact hole may be configured to be provided to intersect at least one end of the channel region in a channel width direction orthogonal to a channel length direction in which the conductor regions face each other.

In the display device according to the disclosure, the contact hole may be configured to be provided to intersect both ends of the channel region in the channel width direction.

In the display device according to the disclosure, the contact hole may be configured to be extended in the channel length direction along the channel region.

In the display device according to the disclosure, the channel region may include a serpentine portion extended in a direction intersecting the channel length direction, and the contact hole may be configured to be extended along the serpentine portion.

In the display device according to the disclosure, a range in which the first opening is provided may be configured to be within a range overlapping with the gate electrode.

In the display device according to the disclosure, the capacitance electrode may be configured to be a first power supply voltage line common to the plurality of pixels.

A manufacturing method of a display device according to the disclosure is a manufacturing method of a display device including a plurality of pixels and pixel circuits corresponding to the plurality of pixels, and the manufacturing method includes performing film formation of a semiconductor film on a substrate, forming a semiconductor layer by patterning the semiconductor film, performing film formation of a gate insulating film on the semiconductor layer, performing film formation of a first metal layer on the gate insulating film, forming a gate electrode by patterning the first metal layer, performing film formation of a first interlayer insulating film on the gate electrode, performing film formation of a second metal layer on the first interlayer insulating film, forming a capacitance electrode including a first opening and a second opening in a portion of a position overlapping with the gate electrode in plan view by patterning the second metal layer, performing film formation of a second interlayer insulating film on the first interlayer insulating film and the capacitance electrode, forming a contact hole surrounded by the first opening and a hole surrounded by the second opening in the first interlayer insulating film and the second interlayer insulating film in plan view by performing patterning, performing annealing, performing film formation of a third metal layer on the second interlayer insulating film, and forming a connection wiring line electrically connected to the gate electrode via the contact hole by patterning the third metal layer.

Advantageous Effects of Disclosure

According to the disclosure, by providing openings of a first interlayer insulating film and a second interlayer insulating film at a location overlapping with a channel region, desorption of hydrogen from the openings occurs, so that the S value of the TFT characteristics increases. By providing a change in the TFT characteristics, a transistor having characteristics corresponding to applications can be obtained.

DESCRIPTION OF EMBODIMENTS

First Embodiment

With reference to the drawings, a display device according to a first embodiment of the disclosure will be described below.

Figure 1:
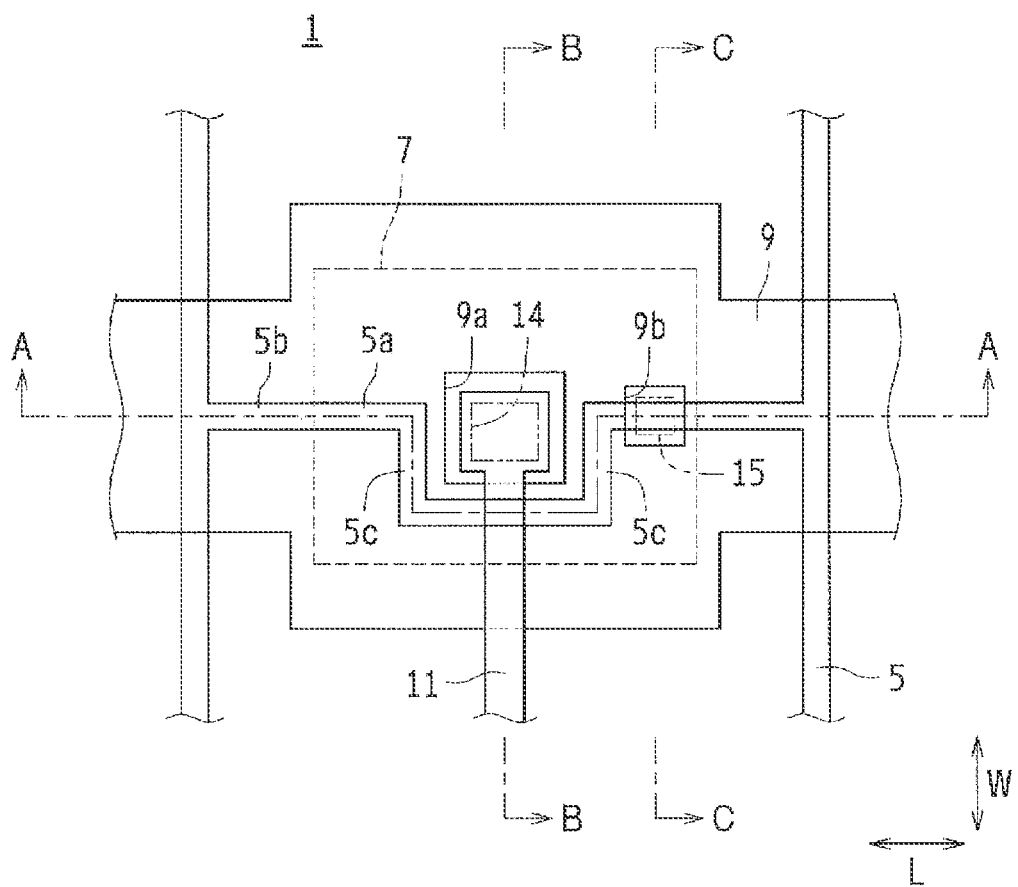
FIG. 1 is a schematic plan view illustrating a vicinity of a drive transistor provided in a display device according to a first embodiment of the disclosure.
Figure 2A:
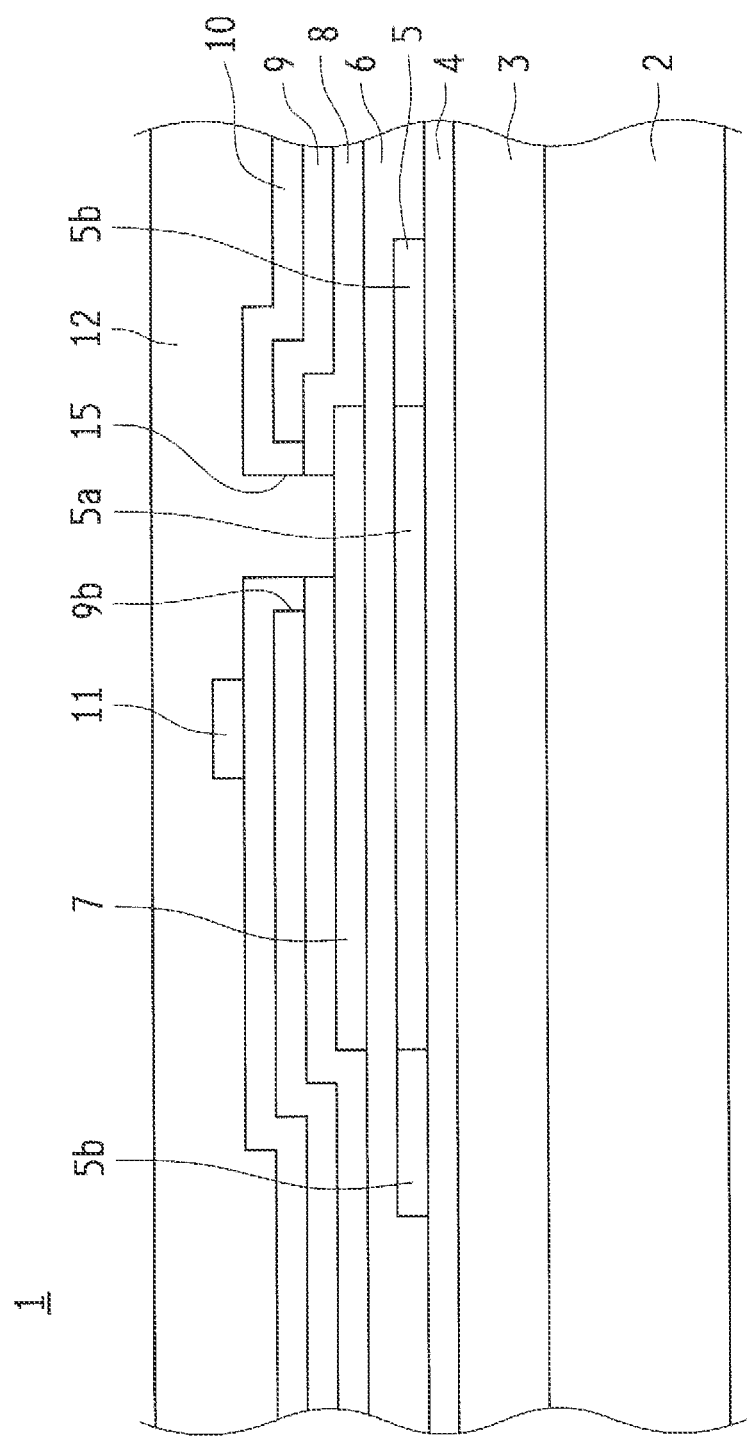
FIG. 2A is a schematic cross-sectional view illustrating a cross section taken along arrow A-A in FIG. 1.
Figure 2B:
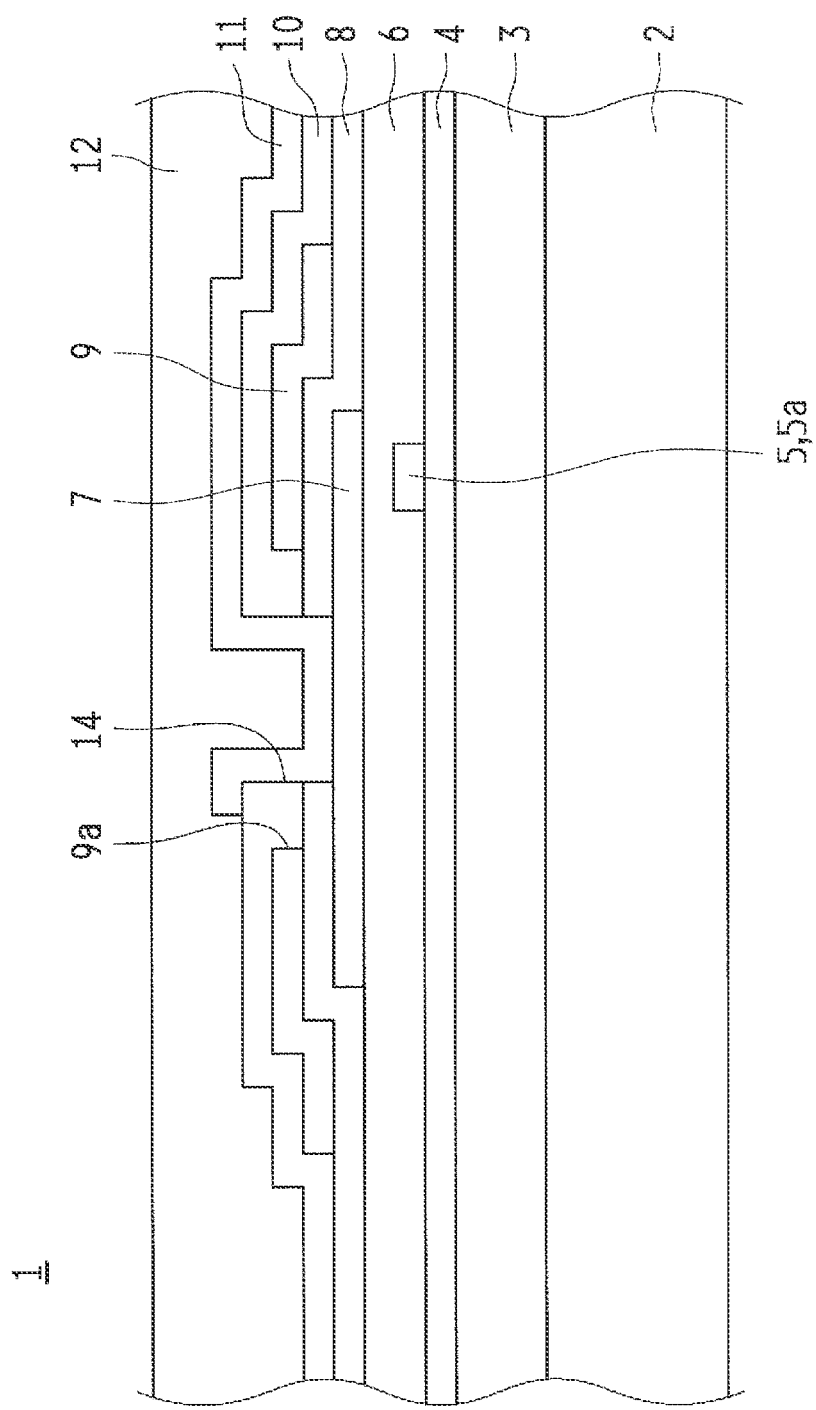
FIG. 2B is a schematic cross-sectional view illustrating a cross section taken along arrow B-B in FIG. 1.

FIG. 1 is a schematic plan view illustrating a vicinity of a drive transistor provided in a display device according to a first embodiment of the disclosure, FIG. 2A is a schematic cross-sectional view illustrating a cross section taken along arrow A-A in FIG. 1, and FIG. 2B is a schematic cross-sectional view illustrating a cross section taken along arrow B-B in FIG. 1.

Note that, in FIG. 1, in consideration of ease of viewing of the drawing, a semiconductor layer 5, electrodes, and the like are extracted to be illustrated, an interlayer insulating film and the like are illustrated in a see-through manner, and the semiconductor layer 5 is illustrated by solid lines. FIG. 2A illustrates a state in which a cross section along the semiconductor layer 5 bent in plan view is developed, and FIG. 2B illustrates a cross section passing through a first opening 9a provided in a capacitance electrode 9. In the following drawings, for drive transistors 1, arrows may be omitted for cross sections at the same location as arrow A-A and arrow B-B in FIG. 1.

In the display device, the semiconductor layer 5, a gate insulating film 6, a gate electrode 7, a first interlayer insulating film 8, a capacitance electrode 9, and a second interlayer insulating film 10 are sequentially layered on a substrate 2. A flexible substrate 3 and a base coat layer 4 are provided between the substrate 2 and the semiconductor layer 5, and a connection wiring line 11 and a flattening film 12 are provided on the second interlayer insulating film 10. Note that a shape of each layer and a positional relationship with each other will be described in detail together with the manufacturing flow described below.

As the substrate 2, for example, a glass substrate, a silicon substrate, and a plastic substrate (resin substrate) having heat resistance can be used. As a material of the plastic substrate (resin substrate), polyethylene terephthalate (PET), polyethylene naphthalate (PEN), polyethersulfone (PES), acrylic resin, polyimide, or the like can be used. Note that a thickness of the substrate 2 is not particularly limited and may be in a form of a thin film.

The flexible substrate 3 is formed of, for example, a polyimide resin (P1) and an inorganic film, and is configured by sandwiching the inorganic film between the polyimide resins.

The base coat layer 4 is an inorganic film formed by film formation of an $SiO_2$ film by CVD. The base coat layer 4 is not limited thereto, and may be formed of, for example, silicon oxide ($SiO_x$), silicon nitride ($SiN_x$), silicon oxynitride ($SiO_xN_y$; x>y), silicon nitride oxide ($SiN_xO_y$; x>y), aluminum oxide, tantalum oxide, and the like, and a plurality of layers may be layered.

The semiconductor layer 5 is made of, for example, polycrystalline silicon (LTPS) formed by a well-known method such as CVD.

Note that a constituting material of the semiconductor layer 5 is not limited to the materials described above, and the semiconductor layer 5 may be formed of other materials. An oxide semiconductor included in the semiconductor layer 5 may be, for example, an amorphous oxide semiconductor, or may be a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The semiconductor layer 5 may have a layered structure having two or more layers, and in this case, the semiconductor layer 5 may include an amorphous oxide semiconductor layer and a crystalline oxide semiconductor layer. Alternatively, the semiconductor layer 5 may include a plurality of crystalline oxide semiconductor layers having different crystal structures, or a plurality of amorphous oxide semiconductor layers.

Next, the material, structure, and the like of the amorphous oxide semiconductor and the crystalline oxide semiconductor will be described in detail. The semiconductor layer 5 may include, for example, at least one metal element among In, Ga, and Zn. Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, In:Ga:Zn=1:1:2, or the like. The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

In place of the In—Ga—Zn—O based semiconductor, the semiconductor layer 5 may include another oxide semiconductor, and may include, for example, an In—Sn—Zn—O based semiconductor. The In—Sn—Zn—O based semiconductor is a ternary oxide of In, Sn (tin), and Zn, and examples thereof include $In_2O_3$—$SnO_2$—ZnO (InSnZnO).

The semiconductor layer 5 is not limited to this, but may include an In-Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, cadmium oxide (CdO), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, $InGaO_3(ZnO)_5$, magnesium zinc oxide ($Mg_xZn_{1-x}O$), cadmium zinc oxide ($Cd_xZn_{1-x}O$), or the like. As the Zn—O based semiconductor, a semiconductor in an amorphous state of ZnO to which an impurity element of one kind or a plurality of kinds among a first group element, a 13-th group element, a 14-th group element, a 15-th group element, or a 17-th group element is added, a polycrystalline state, or a microcrystalline state in which the amorphous state and the polycrystalline state are mixed, or a semiconductor to which no impurity element is added can be used.

The gate insulating film 6 is formed of silicon oxide ($SiO_x$) formed by film formation using CVD. The gate insulating film 6 may be formed of the same material as the base coat layer 4, or may be configured to be a layered structure in which a plurality of layers are layered.

The gate electrode 7 is formed by film formation using a sputtering method, and is a single-layer film formed of Mo. The gate electrode 7 is not limited thereto, and may be, for example, a metal film containing an element selected from aluminum (Al), tungsten (W), molybdenum (Mo), tantalum (Ta), chromium (Cr), titanium (Ti), and copper (Cu), or an alloy film or the like containing these elements as components thereof, or a layered film containing a plurality of these films may be used.

The first interlayer insulating film 8, the second interlayer insulating film 10, and the flattening film 12 are formed of the same materials and by the same method as the base coat layer 4. The capacitance electrode 9 and the connection wiring line 11 are formed of the same materials and by the same method as the gate electrode 7. Note that, furthermore on the flattening film 12, a light-emitting element or the like may be formed, and a contact hole or the like for electrical connection may be formed.

The semiconductor layer 5, the gate electrode 7, the capacitance electrode 9, and the connection wiring line 11 may be appropriately formed by patterning using a known photolithography process. These different layers may be connected as appropriate by providing a contact hole in the interlayer insulating films or the like.

The semiconductor layer 5 is subjected to impurity doping after shaping the gate electrode 7, and only a portion of the semiconductor layer 5, which is not covered with the gate electrode 7 is made conductive. A channel region 5a immediately below the gate electrode 7 is not made conductive, and the exposed portion becomes a conductor region 5b. In other words, in the semiconductor layer 5, the conductor regions 5b adjacent to the channel region 5a function as a source region and a drain region (conduction terminals) in the transistor. In the gate electrode 7, in particular, a portion facing the channel region 5a with the gate insulating film 6 interposed therebetween functions as a gate electrode (control terminal) in the drive transistor 1.

Next, a manufacturing flow of the drive transistor 1 and a detailed shape of each layer will be described with reference to the drawings.

Figure 3:
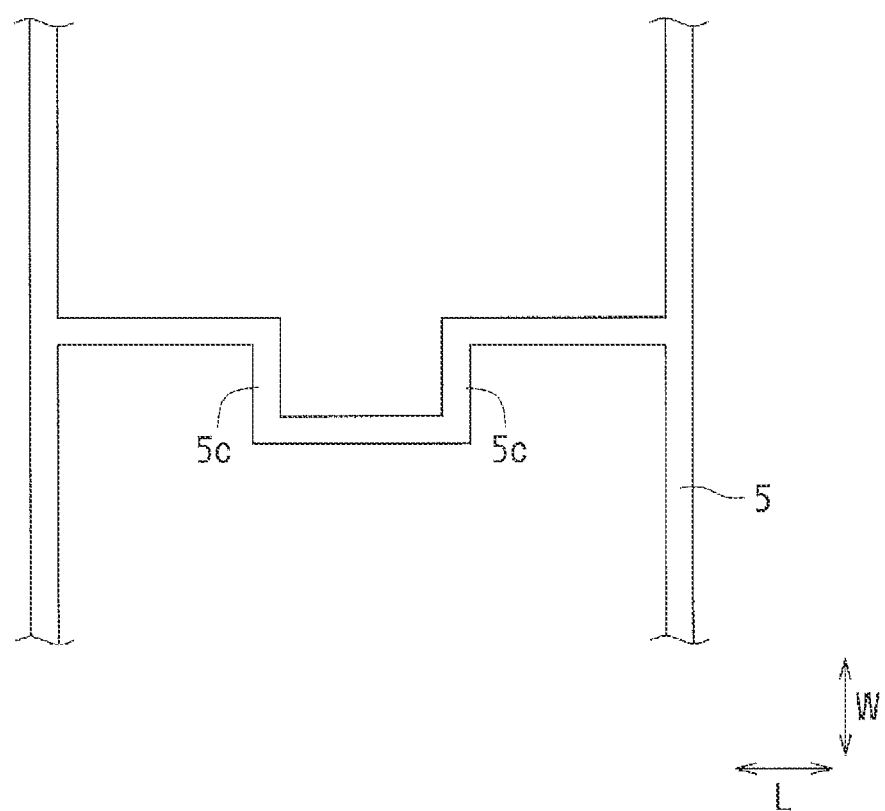
FIG. 3 is a schematic plan view illustrating a drive transistor in a semiconductor layer forming step.
Figure 4A:
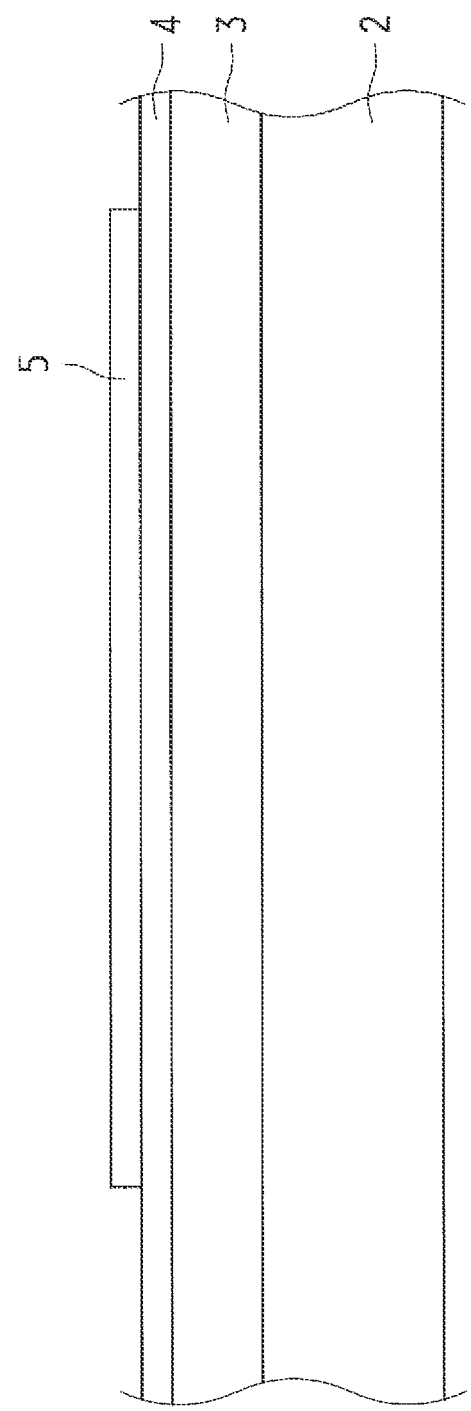
FIG. 4A is a schematic cross-sectional view illustrating a cross section along a channel region of the drive transistor in the semiconductor layer forming step.
Figure 4B:
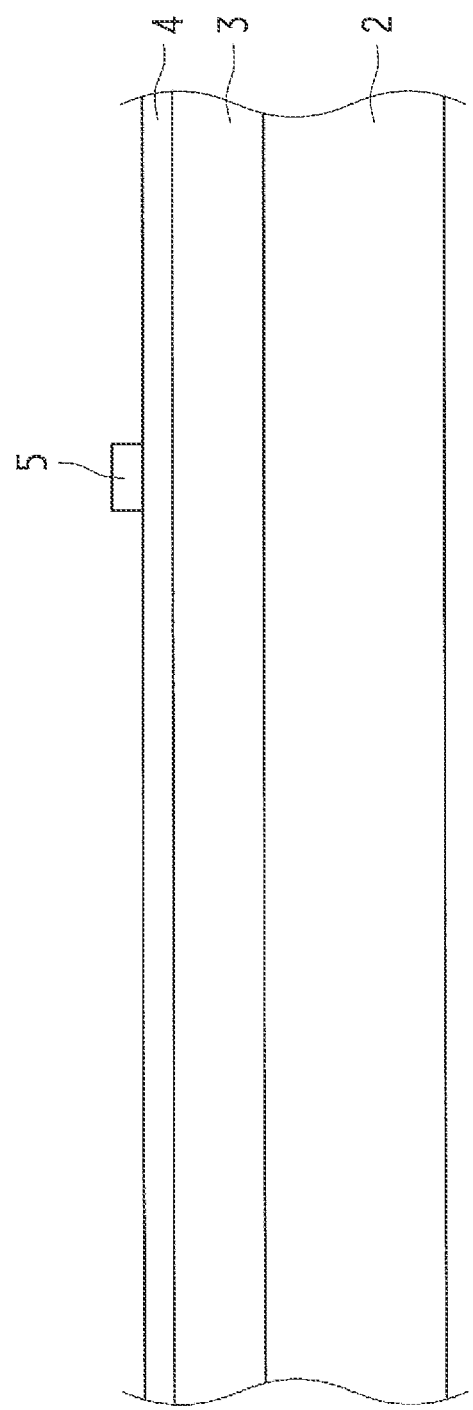
FIG. 4B is a schematic cross-sectional view illustrating a cross section passing through a first opening of the drive transistor in the semiconductor layer forming step.

FIG. 3 is a schematic plan view illustrating a drive transistor in a semiconductor layer forming step, FIG. 4A is a schematic cross-sectional view illustrating a cross section along a channel region of the drive transistor in the semiconductor layer forming step, and FIG. 4B is a schematic cross-sectional view illustrating a cross section passing through a first opening of the drive transistor in the semiconductor layer forming step. In other words, FIG. 4A corresponds to a cross section of the same location as arrow A-A in FIG. 1, and FIG. 4B corresponds to a cross section of the same location as arrow B-B in FIG. 1.

In the manufacturing flow of the drive transistor 1, first, the flexible substrate 3, the base coat layer 4, and a semiconductor film are layered on the entire surface of the substrate 2. The semiconductor layer 5 is formed by patterning the semiconductor film. In other words, by shaping the semiconductor film provided on the entire surface of the substrate 2, the semiconductor layer 5 having the shape illustrated in FIG. 3 is formed.

As illustrated in FIG. 3, the shaped semiconductor layer 5 includes two straight portions extended in a parallel straight line shape and a main body portion connecting the straight portions to each other. Note that the straight portions are further extended toward the outside, and are connected to other elements (for example, a transistor and a light-emitting element) in the display device. For purposes of explanation below, a direction in which the straight portions of the semiconductor layer 5 are extended may be referred to as a channel width direction W, and a direction orthogonal to the channel width direction W may be referred to as a channel length direction L. In other words, the straight portions of the semiconductor layer 5 are spaced apart from each other in the channel length direction L.

The main body portion of the semiconductor layer 5 is generally extended in the channel length direction L, and includes serpentine portions 5c extended in a direction intersecting the channel length direction L. In the present embodiment, the serpentine portions 5c are provided in two locations spaced apart from each other in the channel length direction L. Specifically, as described along a path from the straight portion on the left side in FIG. 3, the main body portion is extended in the channel length direction L (the right direction in FIG. 3), and is bent in the channel width direction W (the downward direction in FIG. 3) at a portion where one serpentine portion 5c is provided. A portion from one serpentine portion 5c to the other serpentine portion 5c is extended in the channel length direction L, and is bent in the channel width direction W (the upward direction in FIG. 3) at a portion where the other serpentine portions 5c is provided. A portion from the other serpentine portion 5c to the straight portion on the right side is extended in the channel length direction L. The lengths of the two serpentine portions 5c extended in the channel width direction W are the same. In other words, the main body portion of the semiconductor layer 5 has a substantially straight line shape along the channel length direction L, and a portion between the two serpentine portions 5c is shifted in the channel width direction W. The portion between the two serpentine portions 5c is located at a substantially mid-point of the two straight portions in the channel length direction L.

Note that in the present embodiment, the serpentine portion 5c is provided so as to be bent at a right angle with respect to the channel length direction L, but without being limited thereto, may be provided so as to be bent obliquely with respect to the channel length direction L. The number and a length of the serpentine portion 5c may be adjusted as appropriate as long as the main body portions are connected to each other to form one continuous line. As described above, by providing the serpentine portion 5c in a portion where the channel region 5a is formed, an effective channel length can be increased to provide a change in the TFT characteristics.

Figure 5:
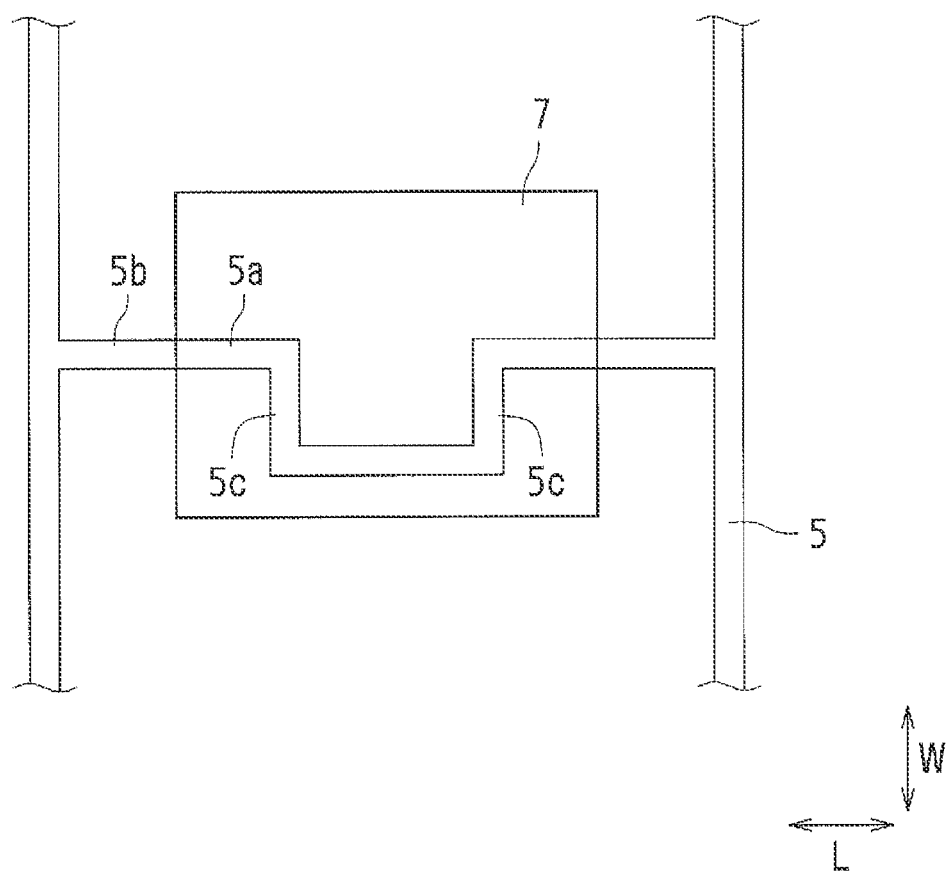
FIG. 5 is a schematic plan view illustrating the drive transistor in a gate electrode forming step.
Figure 6A:
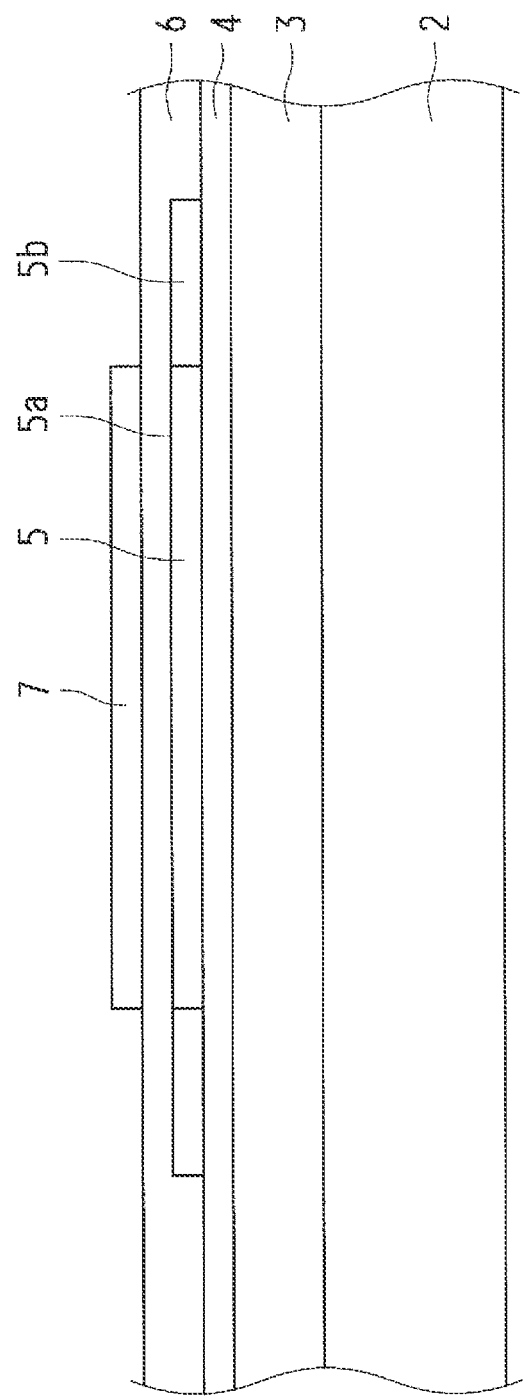
FIG. 6A is a schematic cross-sectional view illustrating a cross section along the channel region of the drive transistor in the gate electrode forming step.
Figure 6B:
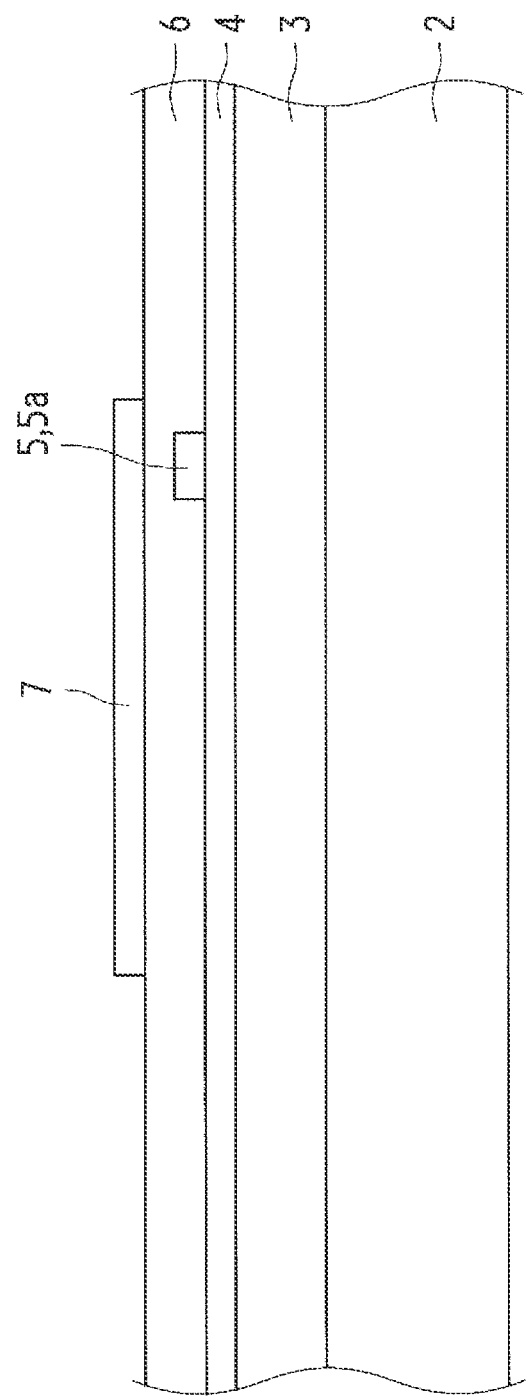
FIG. 6B is a schematic cross-sectional view illustrating a cross section passing through the first opening of the drive transistor in the gate electrode forming step.

FIG. 5 is a schematic plan view illustrating the drive transistor in a gate electrode forming step, FIG. 6A is a schematic cross-sectional view illustrating a cross section along the channel region of the drive transistor in the gate electrode forming step, and FIG. 6B is a schematic cross-sectional view illustrating a cross section passing through the first opening of the drive transistor in the gate electrode forming step. In other words, FIG. 6A corresponds to a cross section of the same location as arrow A-A in FIG. 1, and FIG. 6B corresponds to a cross section of the same location as arrow B-B in FIG. 1.

After the semiconductor layer forming step illustrated in FIG. 3, the gate insulating film 6 and a first metal layer are layered on the entire surface of the substrate 2. The gate electrode 7 is formed by patterning the first metal layer. In other words, by shaping the first metal layer provided on the entire surface of the substrate 2, the gate electrode 7 having the shape illustrated in FIG. 5 is formed. Note that, in the display device, when the first metal layer is patterned, a wiring line or the like provided on the same layer as the gate electrode 7 (see FIG. 27, which will be described later) may be also formed in portions other than the gate electrode 7 illustrated in FIG. 5 with the first metal layer being left.

The gate electrode 7 is substantially rectangular in plan view, overlaps with the main body portion of the semiconductor layer 5, and overlaps so as to include the portion between the two serpentine portions 5c. After the gate electrode 7 is formed, the substrate 2 is subjected to impurity doping, and the channel region 5a and the conductor region 5b are provided in the semiconductor layer 5. As described above, the portion of the semiconductor layer 5 between the two serpentine portions 5c covered with the gate electrode 7 serves as the channel region 5a. For example, in a case of an n-type TFT, P (phosphorus) or the like is applied as an impurity to be doped, and in a case of p-type TFT, B (boron) or the like is applied.

Figure 7:
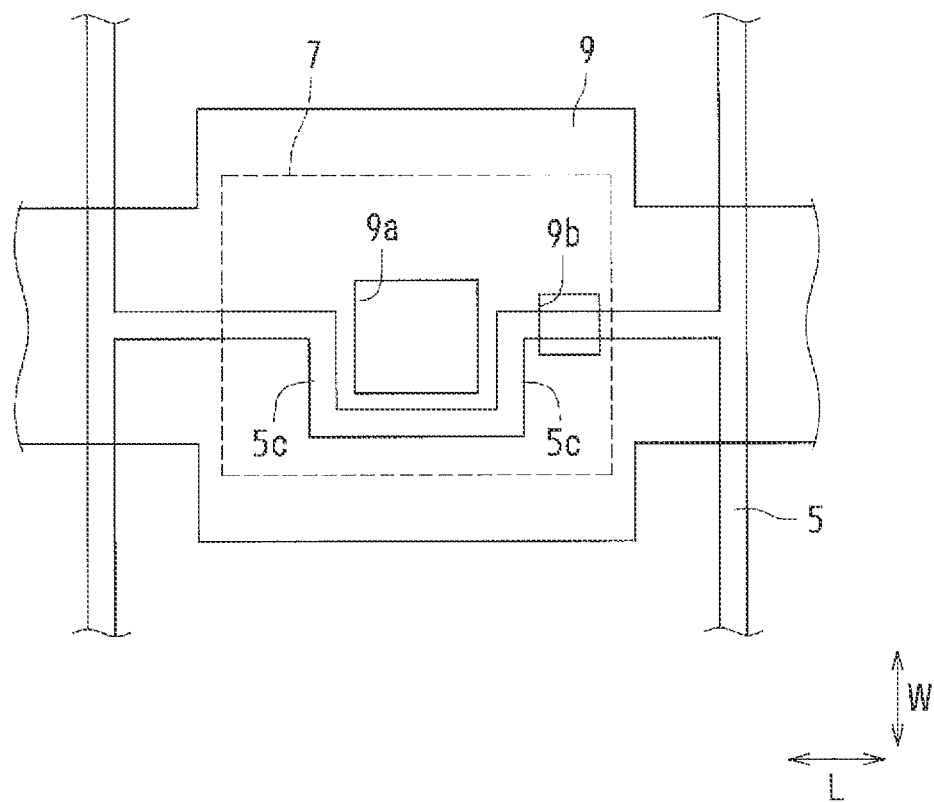
FIG. 7 is a schematic plan view illustrating the drive transistor in a capacitance electrode forming step.
Figure 8A:
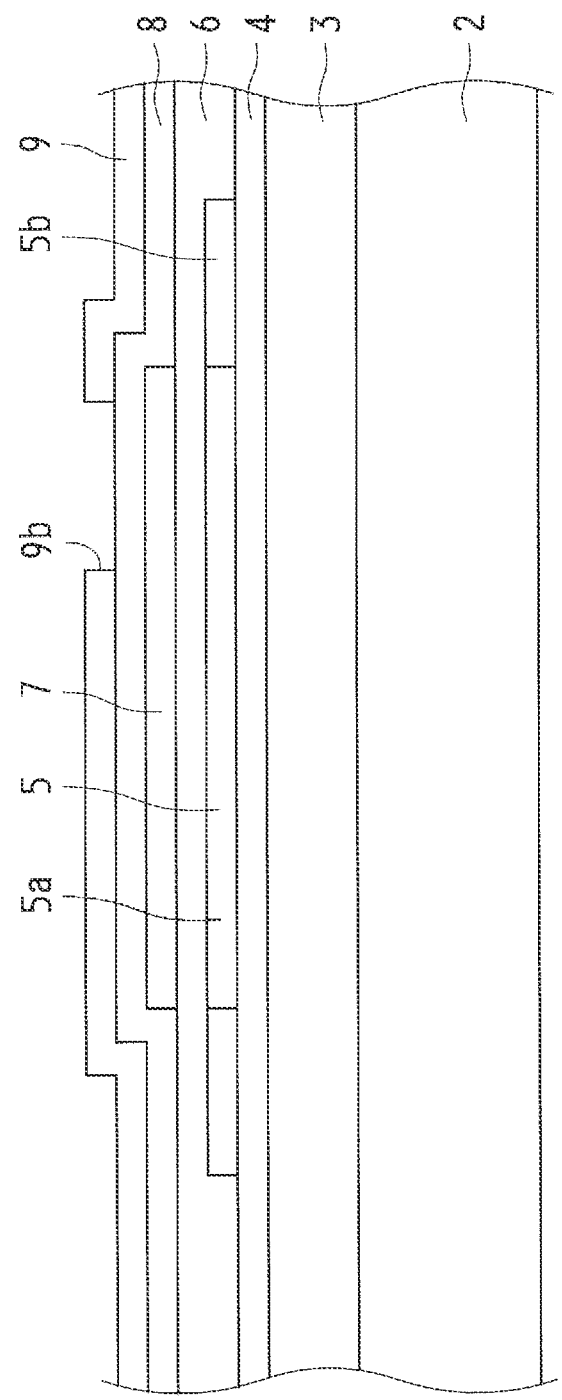
FIG. 8A is a schematic cross-sectional view illustrating a cross section along the channel region of the drive transistor in the capacitance electrode forming step.
Figure 8B:
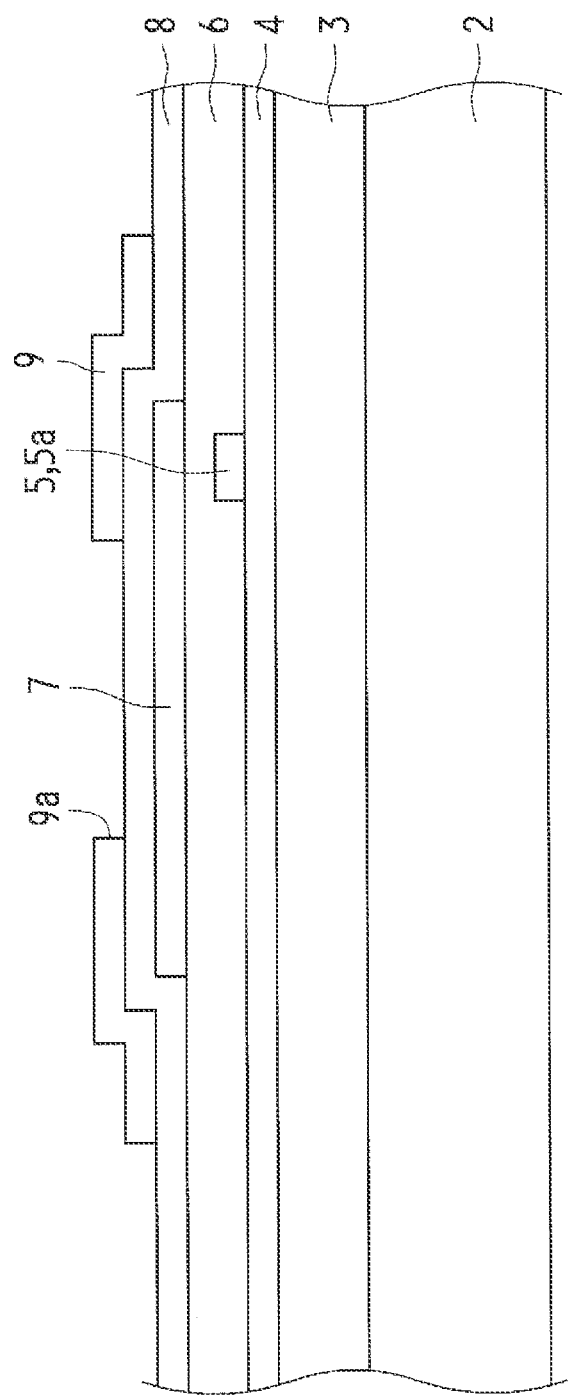
FIG. 8B is a schematic cross-sectional view illustrating a cross section passing through the first opening of the drive transistor in the capacitance electrode forming step.

FIG. 7 is a schematic plan view illustrating the drive transistor in a capacitance electrode forming step, FIG. 8A is a schematic cross-sectional view illustrating a cross section along the channel region of the drive transistor in the capacitance electrode forming step, and FIG. 8B is a schematic cross-sectional view illustrating a cross section passing through the first opening of the drive transistor in the capacitance electrode forming step. In other words, FIG. 8A corresponds to a cross section of the same location as arrow A-A in FIG. 1, and FIG. 8B corresponds to a cross section of the same location as arrow B-B in FIG. 1.

After the gate electrode forming step illustrated in FIG. 5, the first interlayer insulating film 8 and a second metal layer are layered on the entire surface of the substrate 2. The capacitance electrode 9 is formed by patterning the second metal layer. In other words, by shaping the second metal layer provided on the entire surface of the substrate 2, the capacitance electrode 9 having a shape illustrated in FIG. 7 is formed. Note that, in the second metal layer similar to the first metal layer, a wiring line or the like provided on the same layer as the capacitance electrode 9 (see FIG. 27, which will be described later) may be also formed in portions other than the capacitance electrode 9 illustrated in FIG. 7 with the second metal layer being left.

The capacitance electrode 9 has a wide substantially straight line shape extended in the channel length direction L in plan view, and overlaps with the main body portion of the semiconductor layer 5 and the gate electrode 7. Note that the capacitance electrode 9 is extended toward the outside from the straight portion of the semiconductor layer 5, and is connected to the capacitance electrode 9 of an adjacent pixel circuit in the display device.

The capacitance electrode 9 is provided with a first opening 9a and a second opening 9b in a position overlapping with the gate electrode 7 in plan view. The first opening 9a and the second opening 9b are portions where the second metal layer is removed when being patterned, and the first interlayer insulating film 8 is exposed in the portion where the first opening 9a and the second opening 9b are provided in a state illustrated in FIG. 7. The first opening 9a is provided at a position sandwiched between two serpentine portions 5c in the channel length direction L, and does not overlap with the semiconductor layer 5. In other words, the main body portion of the semiconductor layer 5 forms a path bypassing the periphery of the first opening 9a so as to circumvent the first opening 9a. The second opening 9b is provided at a position overlapping with a portion (channel region 5a) of the semiconductor layer 5 extended from the other serpentine portion 5c to the straight portion on the right side. The detailed positional relationship between the second opening 9b and the channel region 5a will be described with reference to FIG. 12 and FIG. 13, which will be described later.

Figure 9:
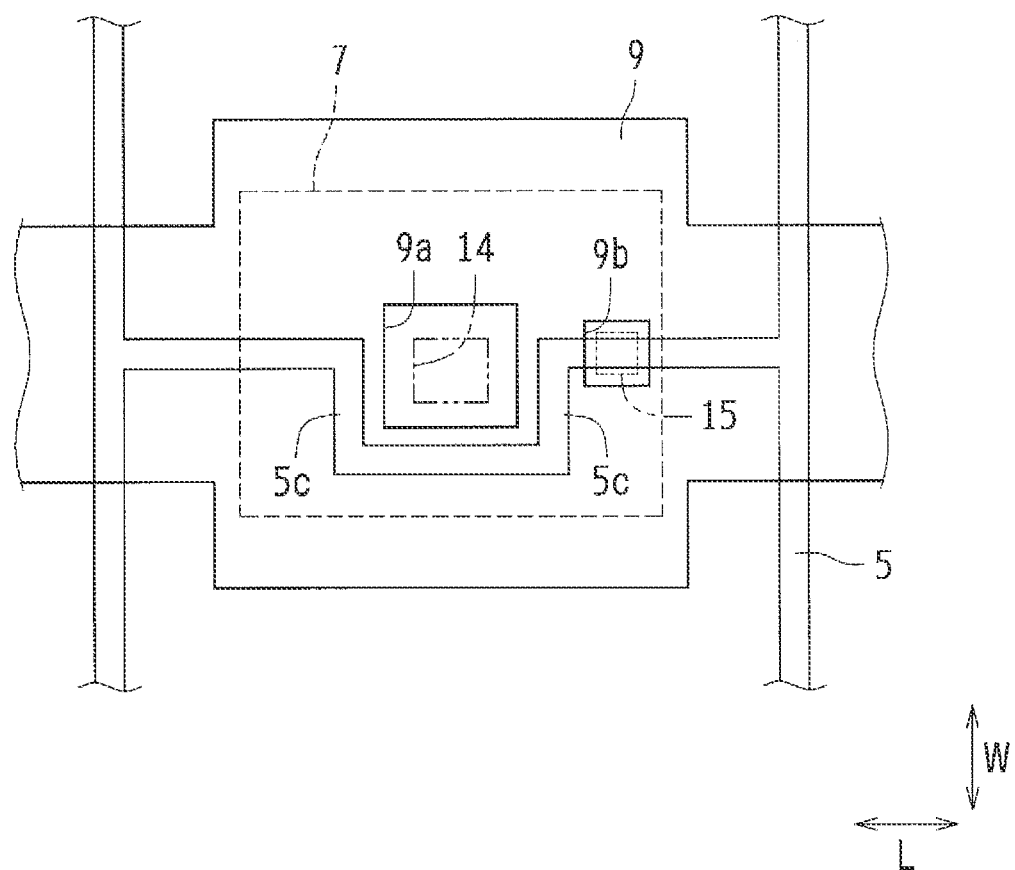
FIG. 9 is a schematic plan view illustrating the drive transistor in an annealing step.
Figure 10A:
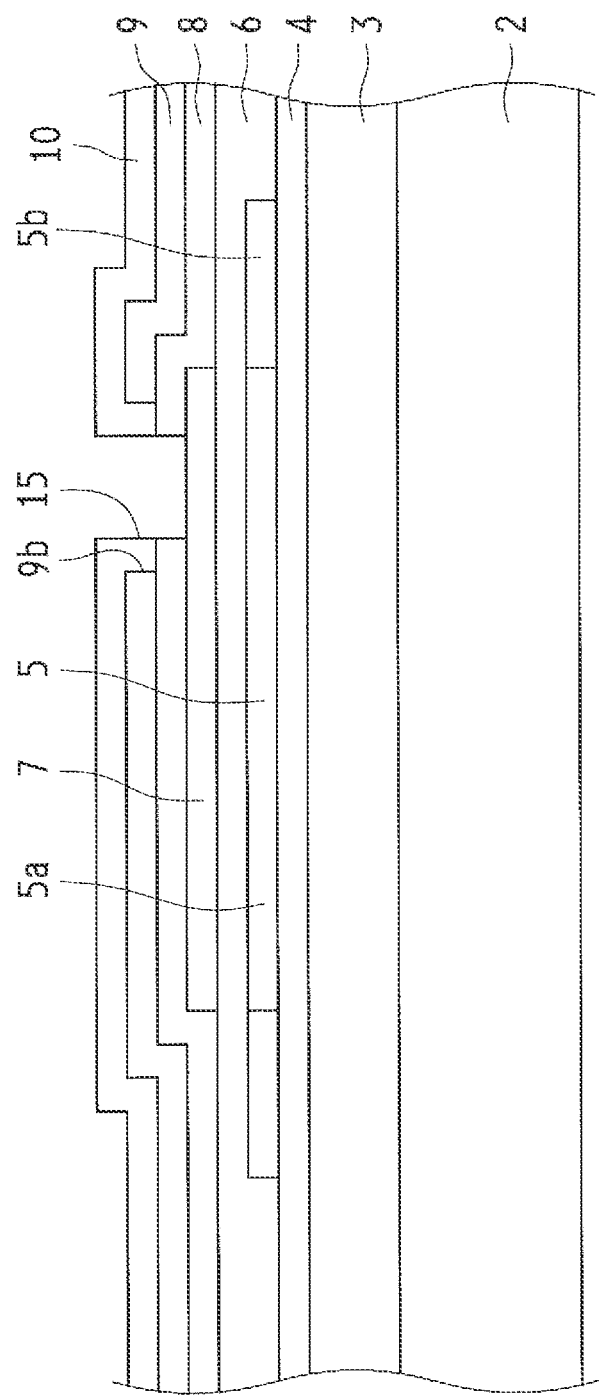
FIG. 10A is a schematic cross-sectional view illustrating a cross section along the channel region of the drive transistor in the annealing step.
Figure 10B:
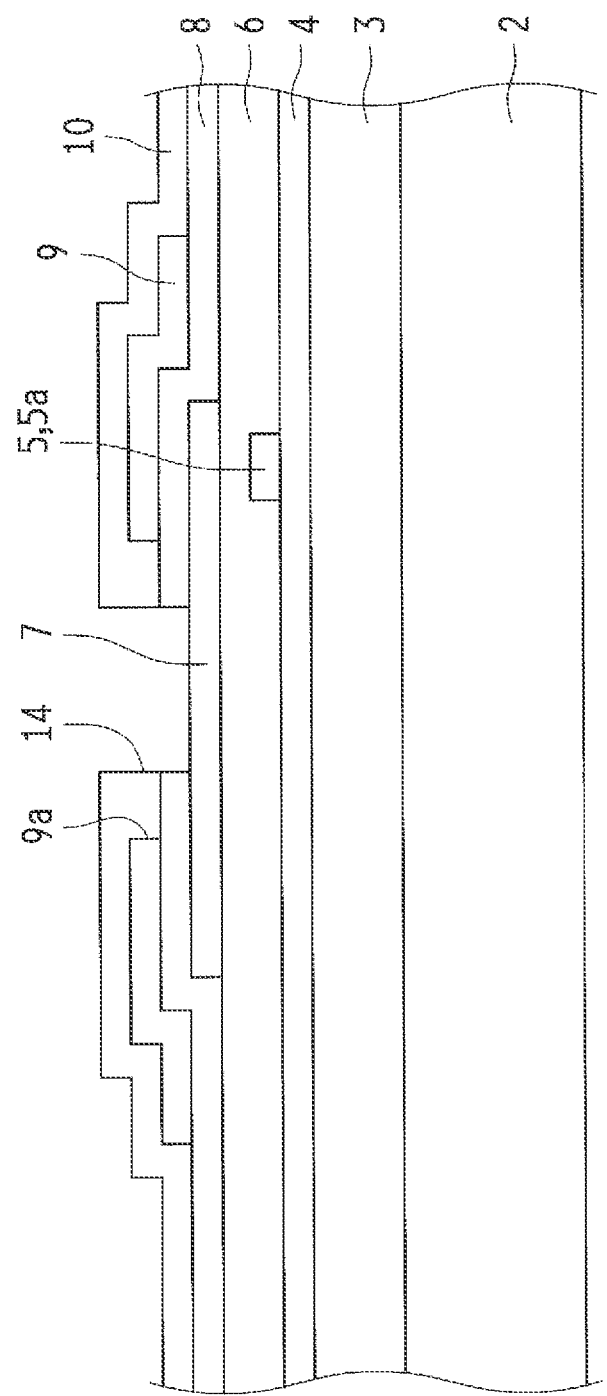
FIG. 10B is a schematic cross-sectional view illustrating a cross section passing through the first opening of the drive transistor in the annealing step.

FIG. 9 is a schematic plan view illustrating the drive transistor in an annealing step, FIG. 10A is a schematic cross-sectional view illustrating a cross section along the channel region of the drive transistor in the annealing step, and FIG. 10B is a schematic cross-sectional view illustrating a cross section passing through the first opening of the drive transistor in the annealing step. In other words, FIG. 10A corresponds to a cross section of the same location as arrow A-A in FIG. 1, and FIG. 10B corresponds to a cross section of the same location as arrow B-B in FIG. 1.

After the capacitance electrode forming step illustrated in FIG. 7, the second interlayer insulating film 10 is layered on the entire surface of the substrate 2, and the first interlayer insulating film 8 and the second interlayer insulating film 10 are patterned to form a contact hole 14 and a hole 15. The contact hole 14 is provided at a position surrounded by the first opening 9a and falls inside the first opening 9a in plan view. The hole 15 is provided at a position surrounded by the second opening 9b and falls inside the second opening 9b in plan view. The first interlayer insulating film 8 and the second interlayer insulating film 10 cover substantially the entire surface of the substrate 2, but in portions where the contact hole 14 and the hole 15 are provided, the first interlayer insulating film 8 and the second interlayer insulating film 10 are removed to expose the gate electrode 7 in a state illustrated in FIG. 9.

In the state where the contact hole 14 and the hole 15 are provided, the substrate 2 is subjected to a hydrogenation treatment by annealing. A heating temperature at the annealing is set to 400° C. When the annealing process is performed in the state in which openings such as the contact hole 14 and the hole 15 are provided, desorption of hydrogen from the openings occurs. In the drive transistor 1 completed through the subsequent steps, a change in characteristics occurs depending on the degree of the desorption of hydrogen due to annealing.

Figure 11A:
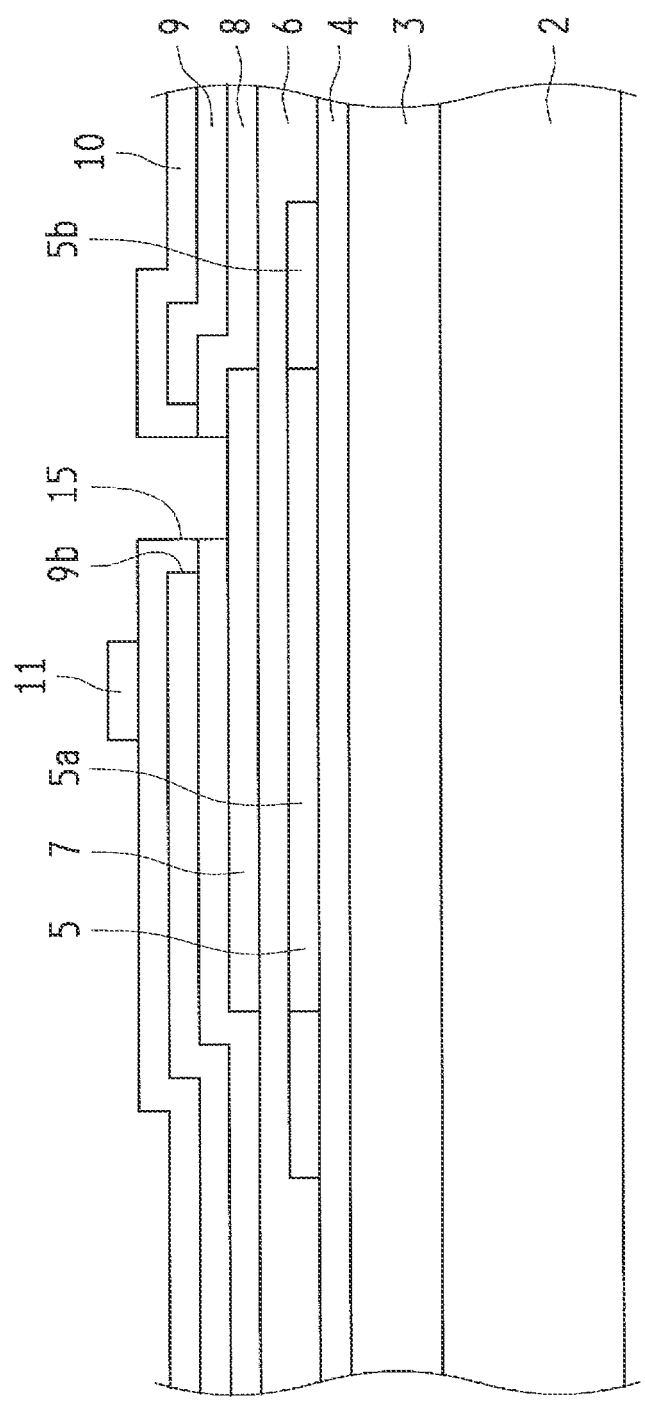
FIG. 11A is a schematic cross-sectional view illustrating a cross section along the channel region of the drive transistor in a connection wiring line forming step.
Figure 11B:
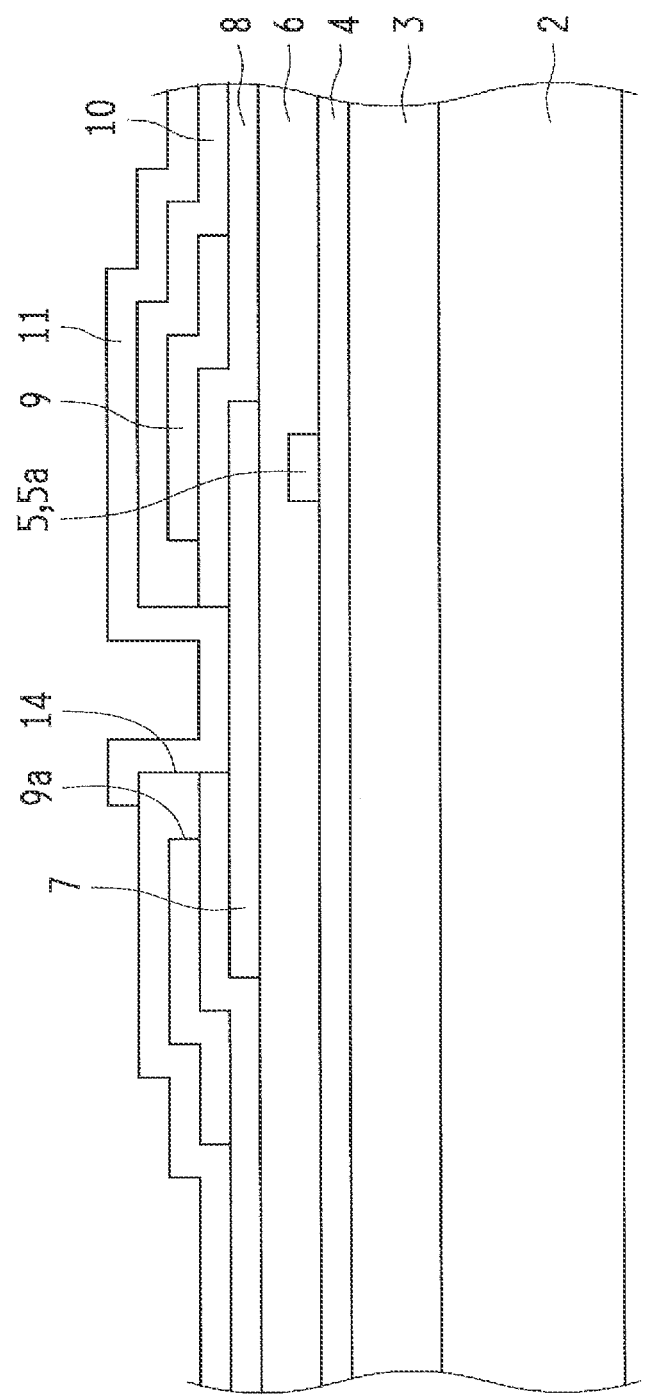
FIG. 11B is a schematic cross-sectional view illustrating a cross section passing through the first opening of the drive transistor in the connection wiring line forming step.

FIG. 11A is a schematic cross-sectional view illustrating a cross section along the channel region of the drive transistor in a connection wiring line forming step, and FIG. 11B is a schematic cross-sectional view illustrating a cross section passing through the first opening of the drive transistor in the connection wiring line forming step.

After the annealing step illustrated in FIG. 9, a third metal layer is layered on the entire surface of the substrate 2. The connection wiring line 11 is formed by patterning the third metal layer. In other words, by shaping the third metal layer provided on the entire surface of the substrate 2, the connection wiring line 11 having a shape illustrated in FIG. 11A and FIG. 11B is formed. Note that, since a plan view in a state in which the connection wiring line 11 is formed is the same as FIG. 1 in which the flattening film 12 is not illustrated, the plan view is omitted. In other words, FIG. 11A corresponds to the cross section at arrow A-A in FIG. 1, and FIG. 11B corresponds to the cross section at arrow B-B in FIG. 1.

The connection wiring line 11 is extended from the contact hole 14 in the channel width direction W (downward in FIG. 1), is extended more outward than the capacitance electrode 9, and is connected to other elements (for example, a transistor and the like) in the display device. The connection wiring line 11 is connected to the gate electrode 7 via the contact hole 14.

After the connection wiring line forming step illustrated in FIG. 11A and FIG. 11B, the flattening film 12 is layered on the entire surface of the substrate 2 to form the drive transistor 1 illustrated in FIG. 1 to FIG. 2B. As described above, by providing the openings of the first interlayer insulating film 8 and the second interlayer insulating film 10 at the location overlapping with the channel region 5a, the desorption of hydrogen from the openings occurs, so that the S value of the TFT characteristics increases. By providing a change in the TFT characteristics, a transistor having characteristics corresponding to applications can be obtained.

Specifically, by increasing the S value, the current change with respect to a gate voltage is made gentle in the transistor. For example, in a configuration in which a current is supplied to a light-emitting element from the above-described transistor, the luminance of the light-emitting element can be controlled in accordance with the current supplied from the transistor.

Figure 12:
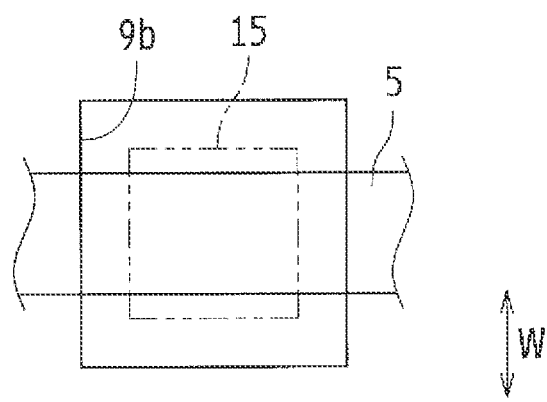
FIG. 12 is an enlarged plan view illustrating a vicinity of a second opening in an enlarged manner.
Figure 13:
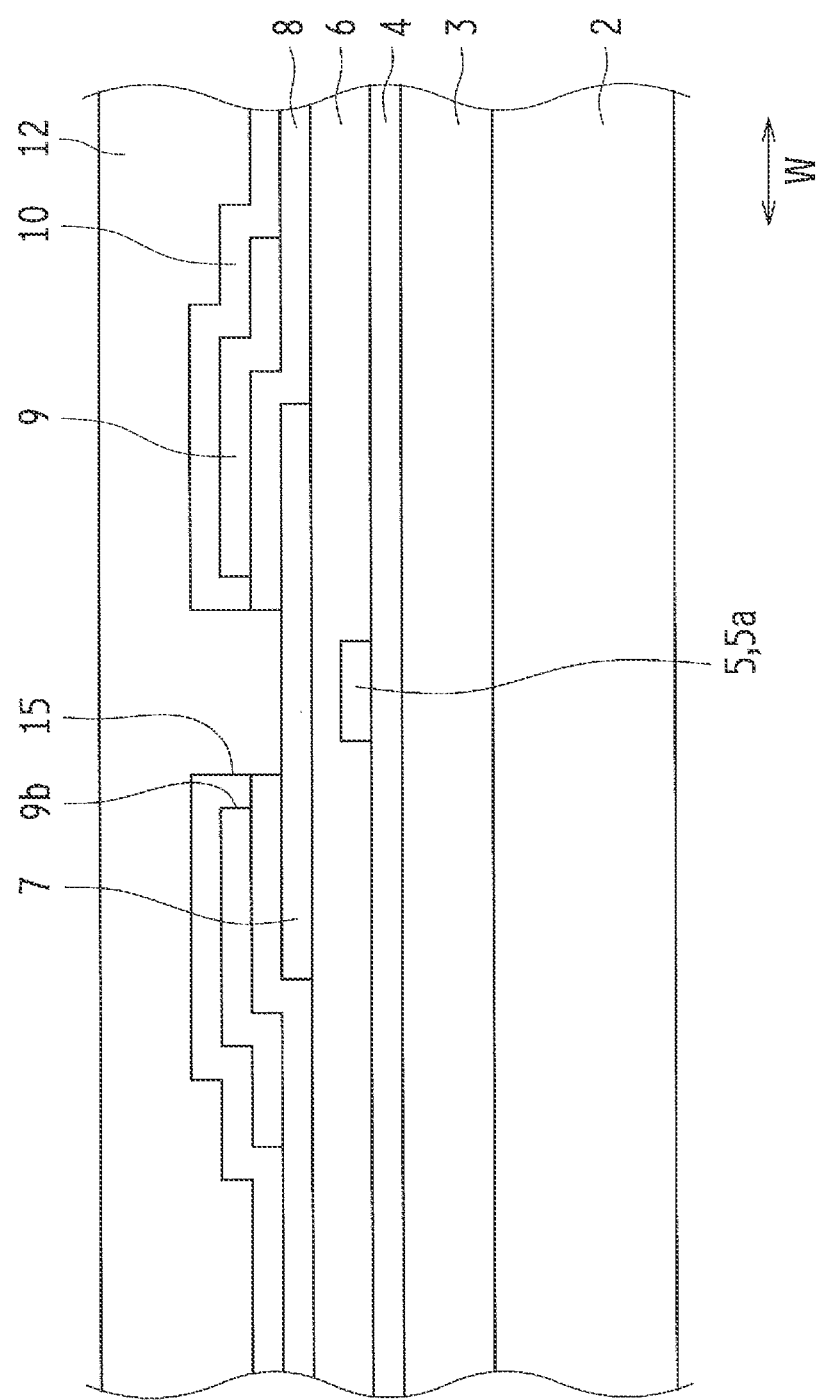
FIG. 13 is a schematic cross-sectional view illustrating a cross section passing through the second opening.

FIG. 12 is an enlarged plan view illustrating a vicinity of the second opening in an enlarged manner, and FIG. 13 is a schematic cross-sectional view illustrating a cross section passing through the second opening. In other words, FIG. 13 corresponds to a cross section at arrow C-C in FIG. 1.

The second opening 9b and the hole 15 have widths wider than that of the channel region 5a in the channel width direction W, and are located immediately above the channel region 5a. That is, the hole 15 is provided intersecting both ends (the upper side and the lower side in FIG. 12) of the channel region 5a in the channel width direction W. In other words, the hole 15 is disposed such that the entire width of the channel region 5a falls inside the hole 15. In this way, by increasing the area where the channel region 5a and the hole 15 overlap with each other, the desorption of hydrogen can be promoted.

Note that the arrangement of the hole 15 is not limited thereto, and may be slightly shifted from the channel region 5a. Next, a first modified example in which the arrangement of the hole 15 is changed will be described with reference to FIG. 14 and FIG. 15.

Figure 14:
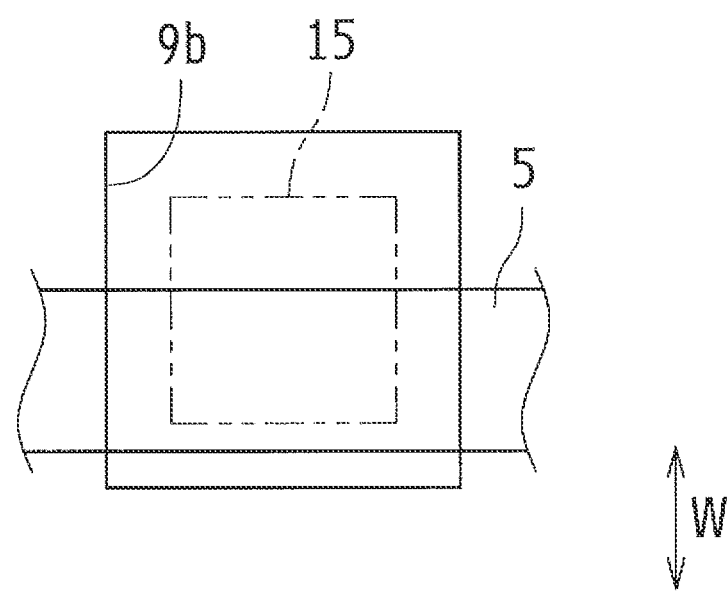
FIG. 14 is an enlarged plan view illustrating a vicinity of a second opening in an enlarged manner in a first modified example.
Figure 15:
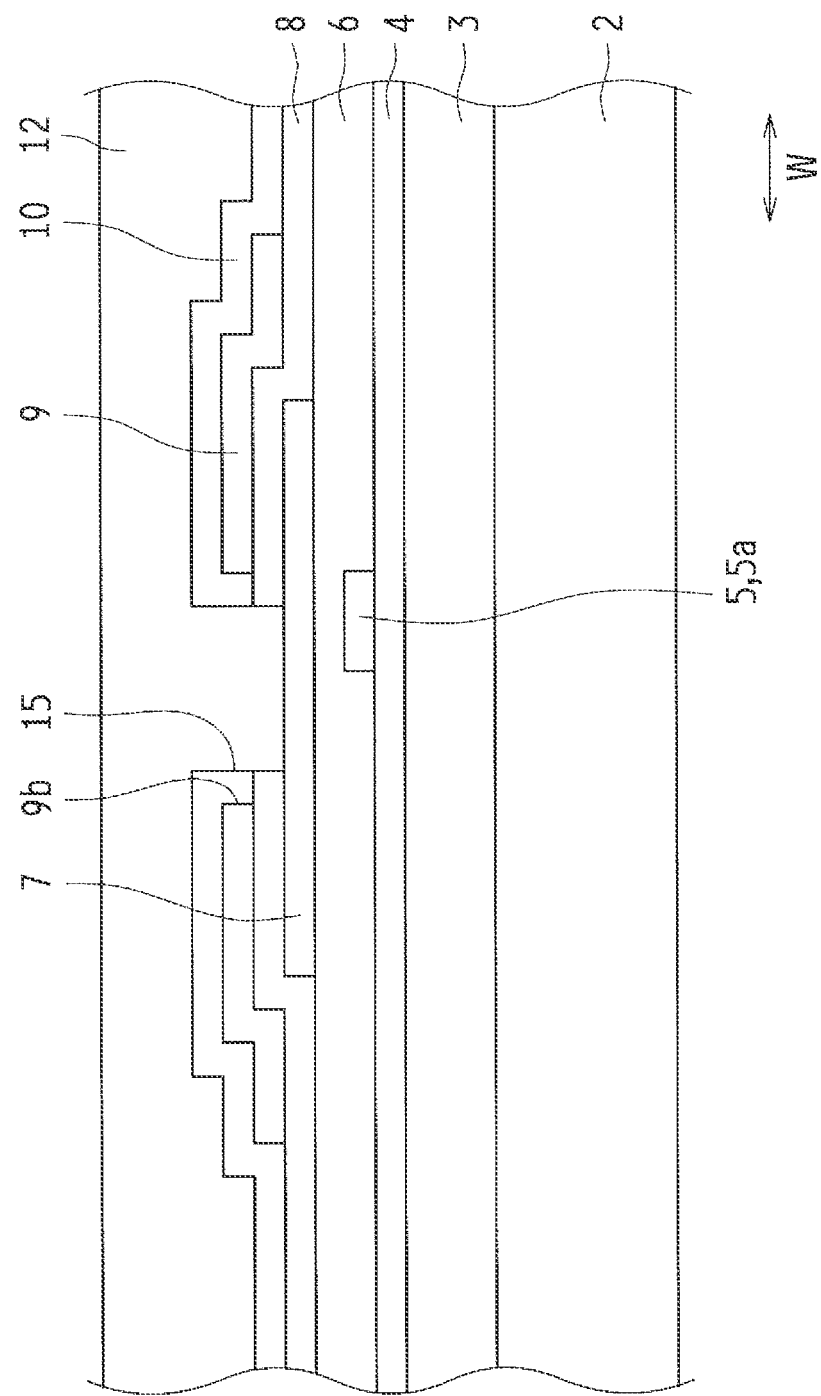
FIG. 15 is a schematic cross-sectional view illustrating a cross section passing through the second opening in the first modified example.

FIG. 14 is an enlarged plan view illustrating a vicinity of the second opening in an enlarged manner in the first modified example, and FIG. 15 is a schematic cross-sectional view illustrating a cross section passing through the second opening in the first modified example. In other words, FIG. 15 corresponds to the cross section at arrow C-C in FIG. 1.

In the first modified example, the second opening 9b and the hole 15 are provided at positions shifted in the channel width direction W from immediately above the channel region 5a. In other words, the hole 15 is provided intersecting one end (the upper side in FIG. 14) of the channel region 5a in the channel width direction W. As illustrated in FIG. 15, the channel region 5a of a portion corresponding to the hole 15 has a portion of its width which falls inside the hole 15, but also has a portion not overlapping with the hole 15 (covered with the first interlayer insulating film 8 and the second interlayer insulating film 10). In this way, by adjusting the area where the channel region 5a and the hole 15 overlap with each other, the degree of the desorption of hydrogen can be differentiated.

Next, a second modified example in which the arrangement of the hole 15 is changed will be described with reference to FIG. 16 and FIG. 17.

Figure 16:
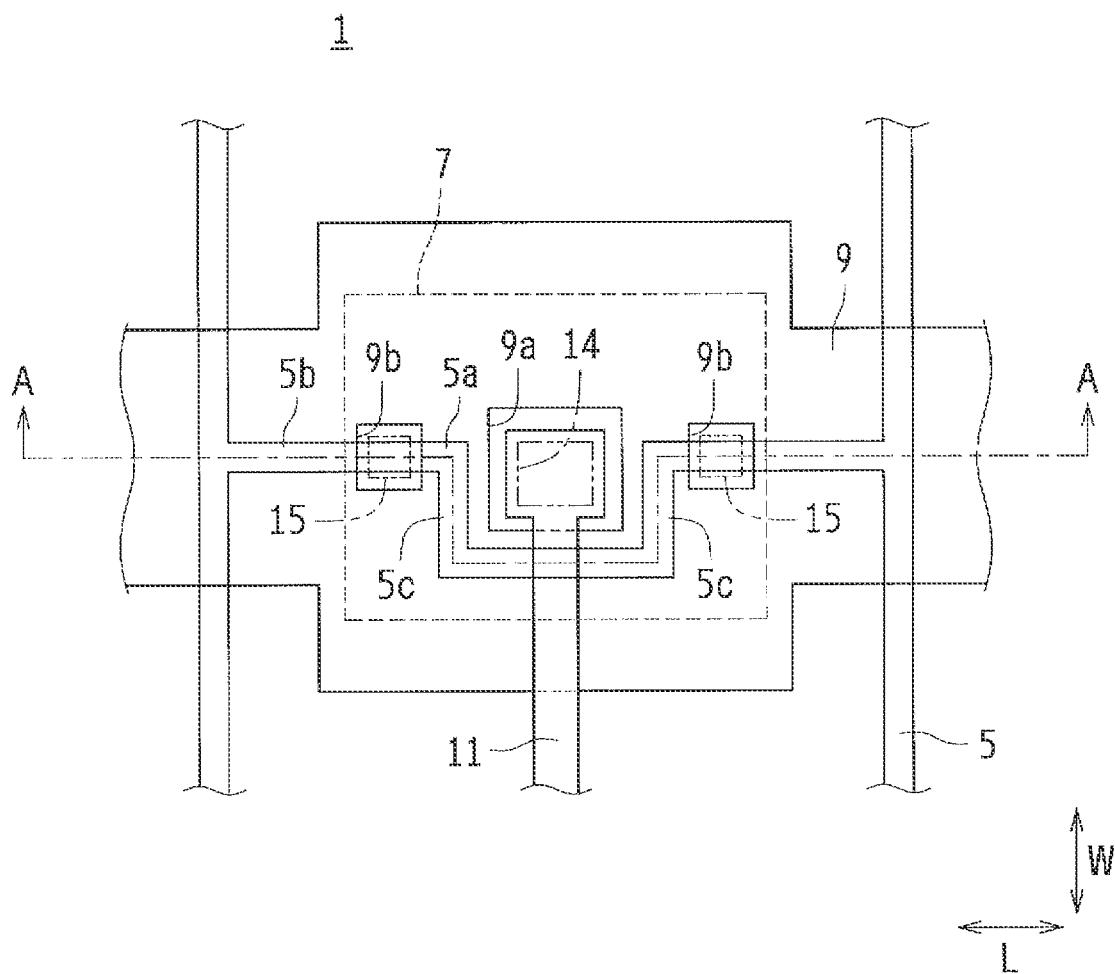
FIG. 16 is a schematic plan view illustrating a vicinity of a drive transistor in a second modified example.
Figure 17:
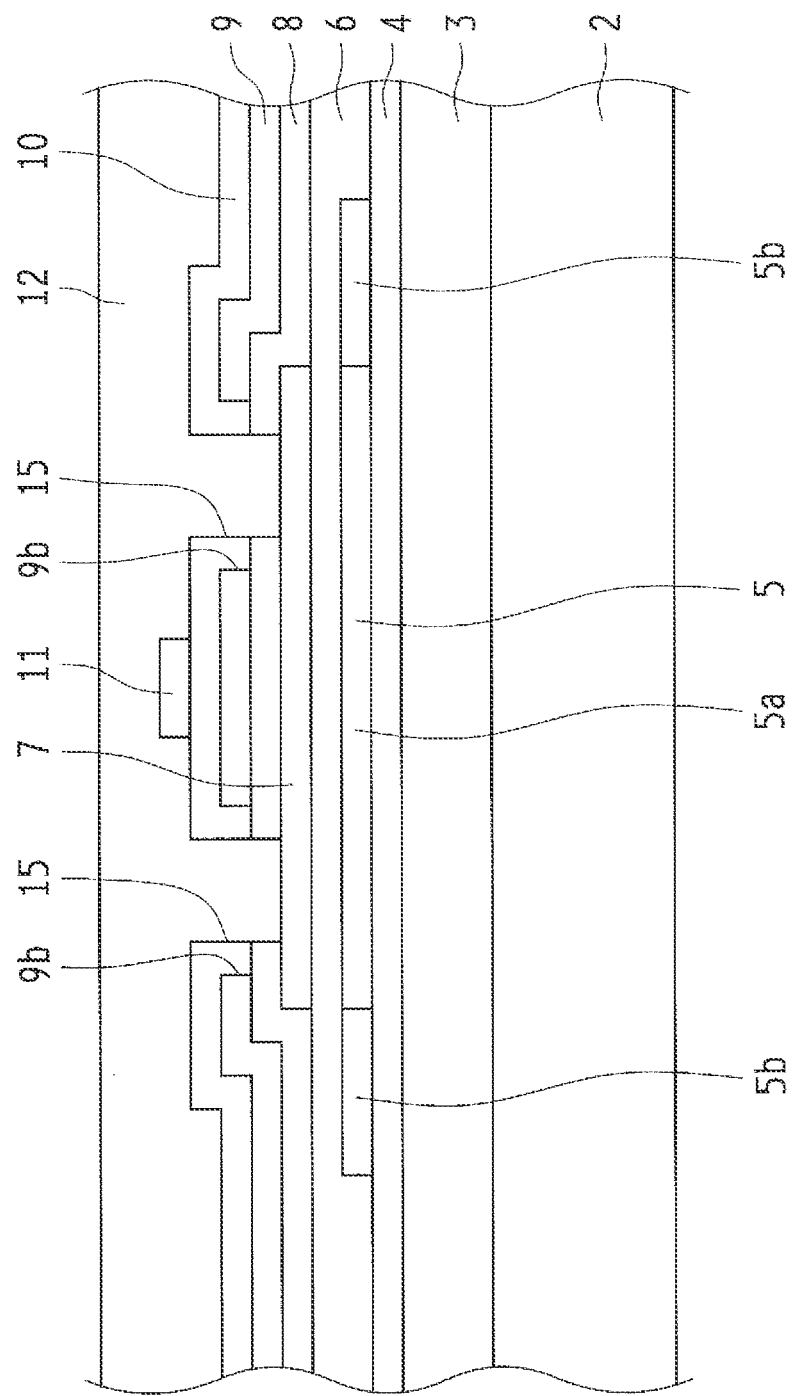
FIG. 17 is a schematic cross-sectional view illustrating a cross section along a channel region of the drive transistor in the second modified example.

FIG. 16 is a schematic plan view illustrating a vicinity of the drive transistor in the second modified example, and FIG. 17 is a schematic cross-sectional view illustrating a cross section along the channel region of the drive transistor in the second modified example. In other words, FIG. 17 corresponds to a cross section at the same location as arrow A-A in FIG. 1. Note that in the second modified example, since the cross section passing through the contact hole 14 is the same as that of FIG. 2B, the cross section is omitted.

In the second modified example, the second openings 9b and the holes 15 are provided in two locations. Specifically, the second openings 9b are provided at a position overlapping with a portion of the semiconductor layer 5 extended from one serpentine portion 5c to the straight portion on the left side and at a position overlapping with a portion extended from the other serpentine portion 5c to the straight portion on the right side. The holes 15 are provided corresponding to each of the two second openings 9b at the two locations. In this way, by changing the number of the hole 15, the effect of the desorption of hydrogen can be made more significant.

Next, a third modified example in which the arrangement of the contact hole 14 is changed will be described with reference to FIG. 18 and FIG. 19.

Figure 18:
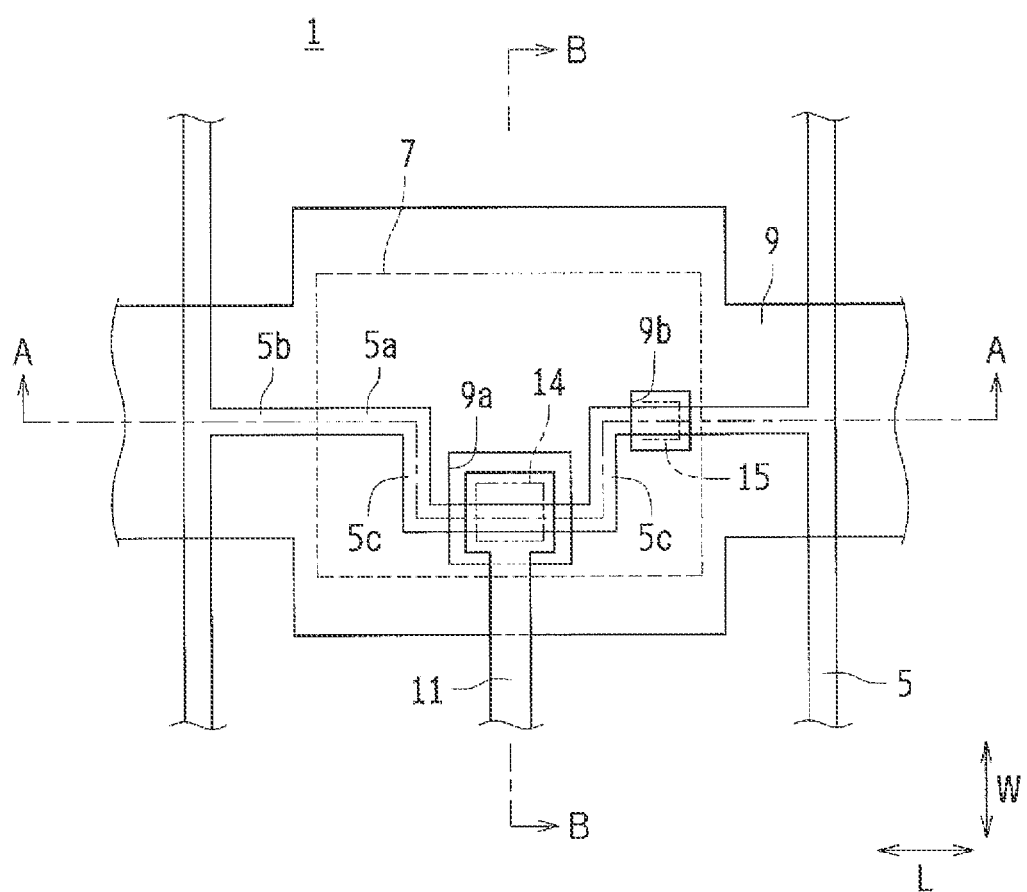
FIG. 18 is a schematic plan view illustrating a vicinity of a drive transistor in a third modified example.
Figure 19A:
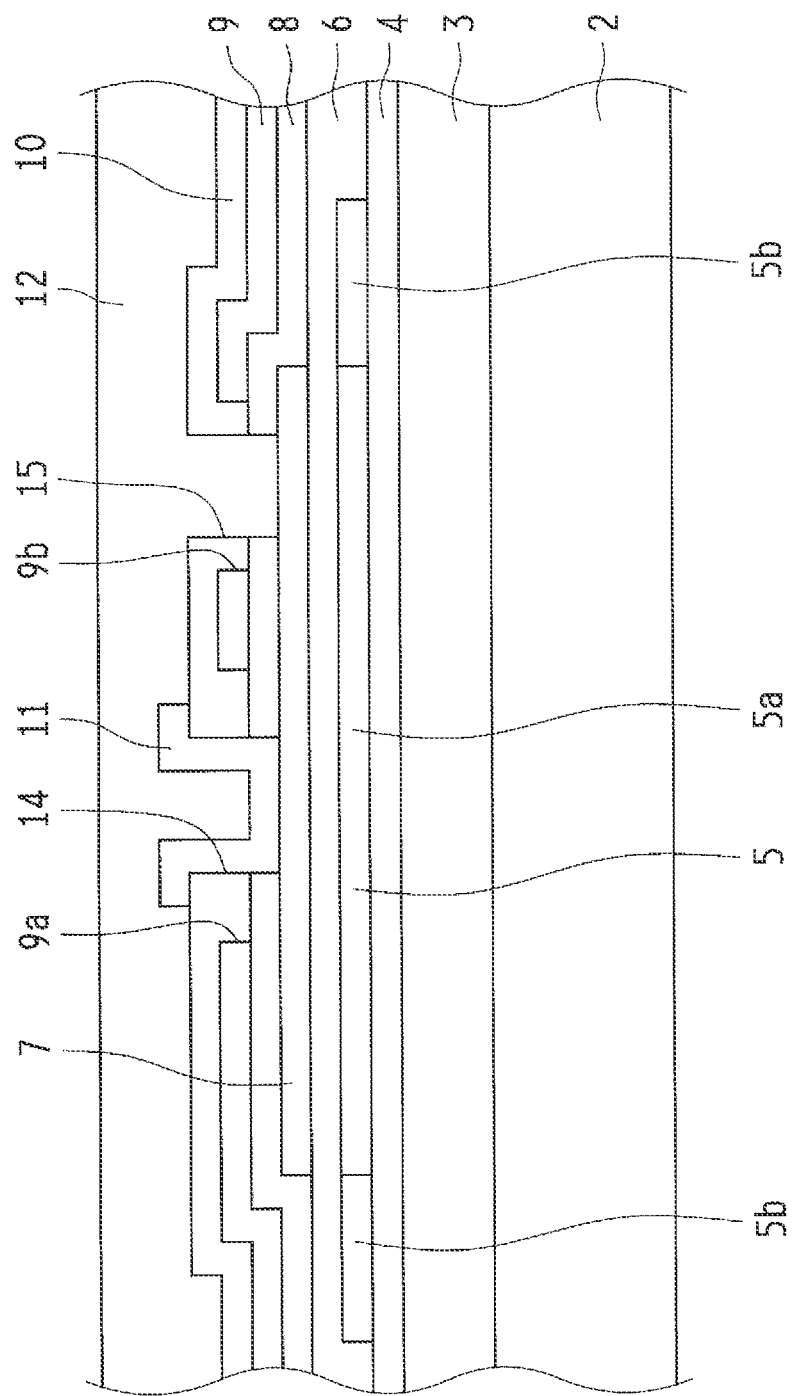
FIG. 19A is a schematic cross-sectional view illustrating a cross section along a channel region of the drive transistor in the third modified example.
Figure 19B:
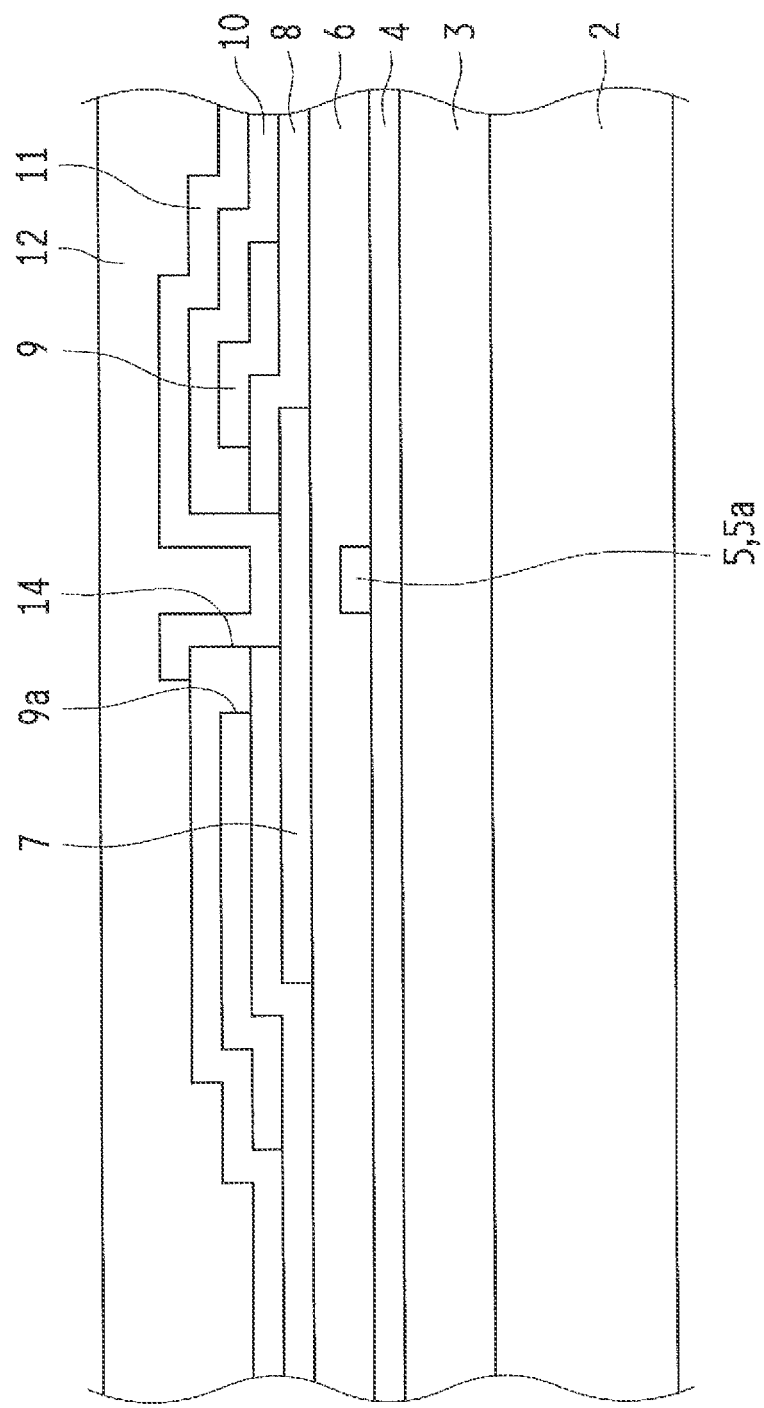
FIG. 19B is a schematic cross-sectional view illustrating a cross section passing through a first opening in the third modified example.

FIG. 18 is a schematic plan view illustrating a vicinity of the drive transistor in the third modified example, FIG. 19A is a schematic cross-sectional view illustrating a cross section along the channel region of the drive transistor in the third modified example, and FIG. 19B is a schematic cross-sectional view illustrating a cross section passing through the first opening in the third modified example. In other words, FIG. 19A corresponds to a cross section of the same location as arrow A-A in FIG. 1, and FIG. 19B corresponds to a cross section of the same location as arrow B-B in FIG. 1.

In third modified example, the first opening 9a and the contact hole 14 are provided at positions overlapping with the channel region 5a in plan view. Specifically, the first opening 9a overlaps with a portion of the semiconductor layer 5 extended in the channel length direction L between the two serpentine portions 5c, and the contact hole 14 is provided at a position corresponding to the first opening 9a. In this way, by overlapping not only the hole 15 but also the contact hole 14 with the channel region 5a, the desorption of hydrogen from the contact hole 14 can be promoted.

Second Embodiment

Next, with reference to drawings, a display device according to a second embodiment of the disclosure will be described. Note that, in the second embodiment, constituent elements having substantially identical functions to those of the first embodiment will be denoted by the identical reference signs, and descriptions thereof will be omitted.

Figure 20:
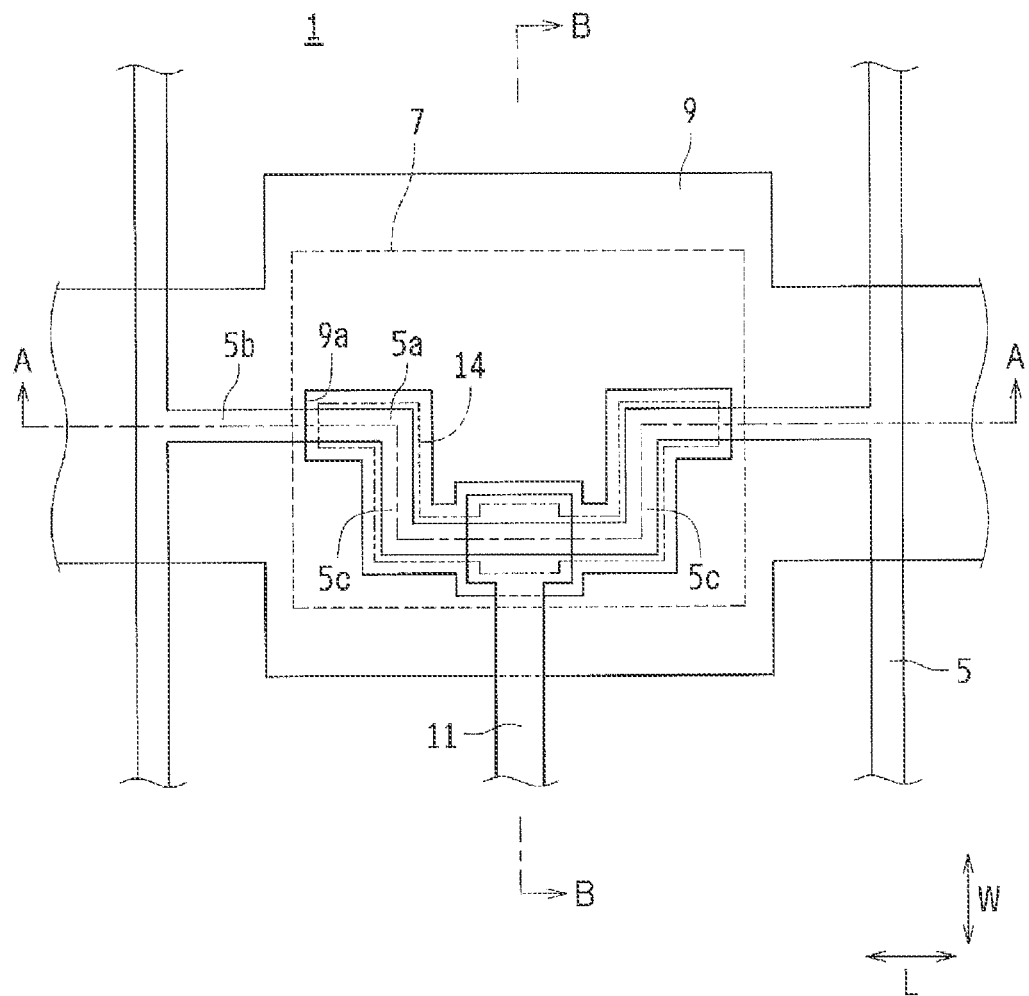
FIG. 20 is a schematic plan view illustrating a vicinity of a drive transistor provided in a display device according to a second embodiment of the disclosure.
Figure 21A:
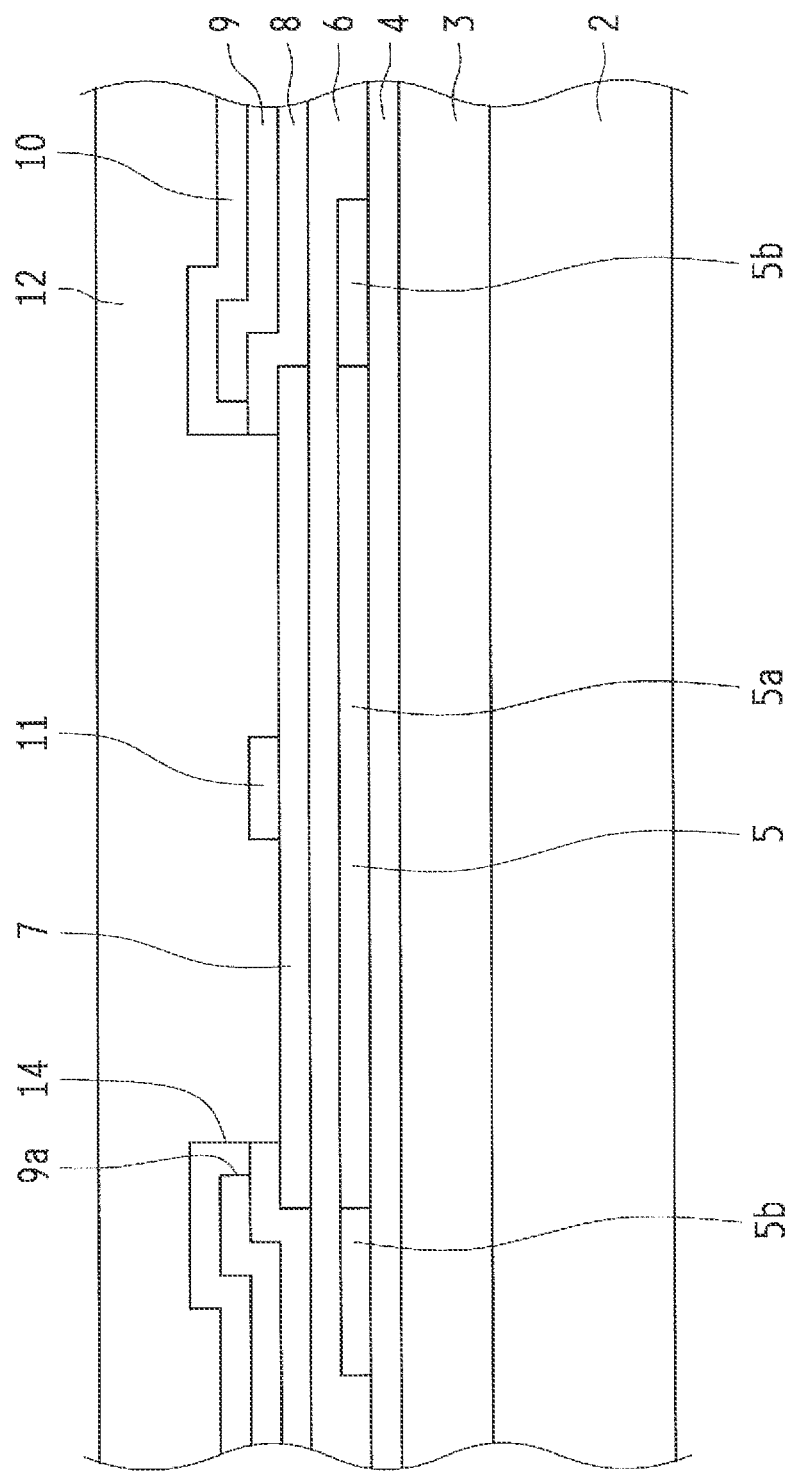
FIG. 21A is a schematic cross-sectional view illustrating a cross section taken along arrow A-A in FIG. 20.
Figure 21B:
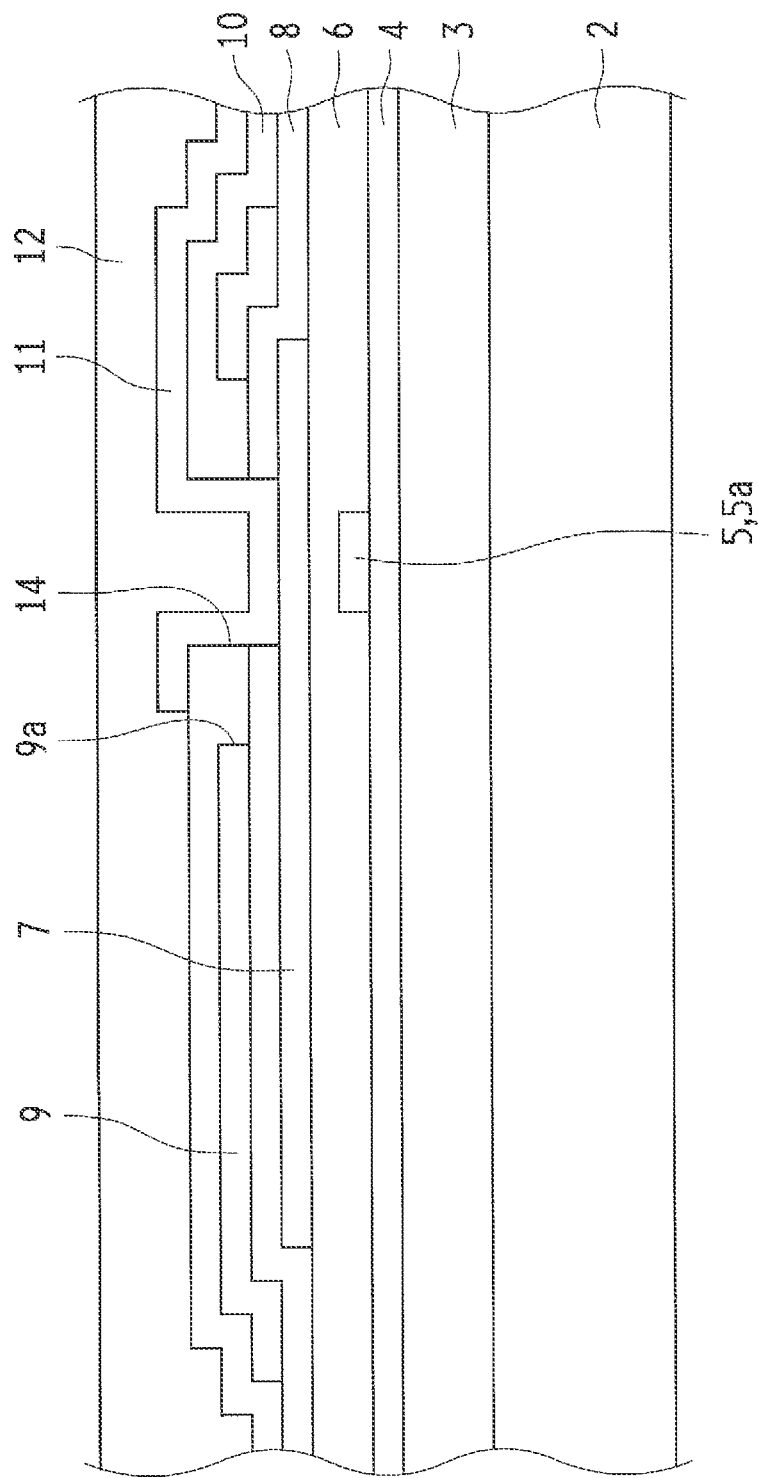
FIG. 21B is a schematic cross-sectional view illustrating a cross section taken along arrow B-B in FIG. 20.

FIG. 20 is a schematic plan view illustrating a vicinity of the drive transistor provided in a display device according to the second embodiment of the disclosure, FIG. 21A is a schematic cross-sectional view illustrating a cross section taken along arrow A-A in FIG. 20, and FIG. 21B is a schematic cross-sectional view illustrating a cross section taken along arrow B-B in FIG. 20.

The second embodiment differs from the first embodiment in a shape of the contact hole 14. Specifically, in the second embodiment, as in the third modified example, the capacitance electrode 9 and the connection wiring line 11 are connected each other via the contact hole 14 at a position overlapping with the channel region 5a in plan view. Here, the contact hole 14 is widely provided so as to overlap with not only the portion where the connection wiring line 11 is provided but also substantially the entire channel region 5a. The contact hole 14 extended along the channel region 5a is integrated with the hole 15 in the first embodiment. In other words, the contact hole 14 in the second embodiment corresponds to both the contact hole 14 and the hole 15 in the first embodiment. Note that the range in which the first opening 9a is provided is preferably within a range overlapping with the gate electrode 7. In other words, the first opening 9a preferably falls in the range overlapping with the gate electrode 7, and the first interlayer insulating film 8 and the second interlayer insulating film 10 immediately above the conductor region 5b are preferably left.

Next, a manufacturing flow of the drive transistor 1 according to the second embodiment of the disclosure will be described with reference to drawings. Note that after the gate electrode forming step illustrated in FIG. 5, steps up to the step of layering the first interlayer insulating film 8 and the second metal layer on the entire surface of the substrate 2 are the same as those of the first embodiment, so that the description and drawings are omitted.

Figure 22:
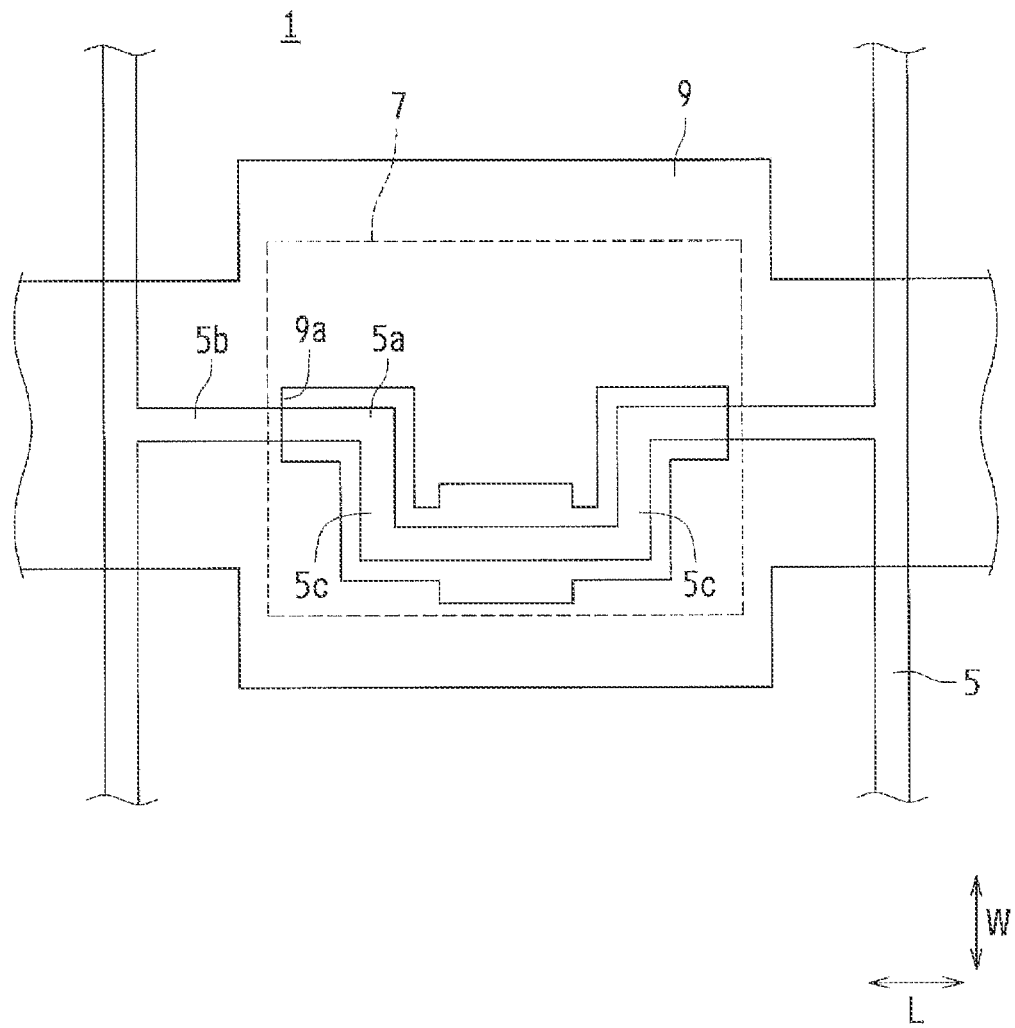
FIG. 22 is a schematic plan view illustrating the drive transistor in a capacitance electrode forming step.
Figure 23A:
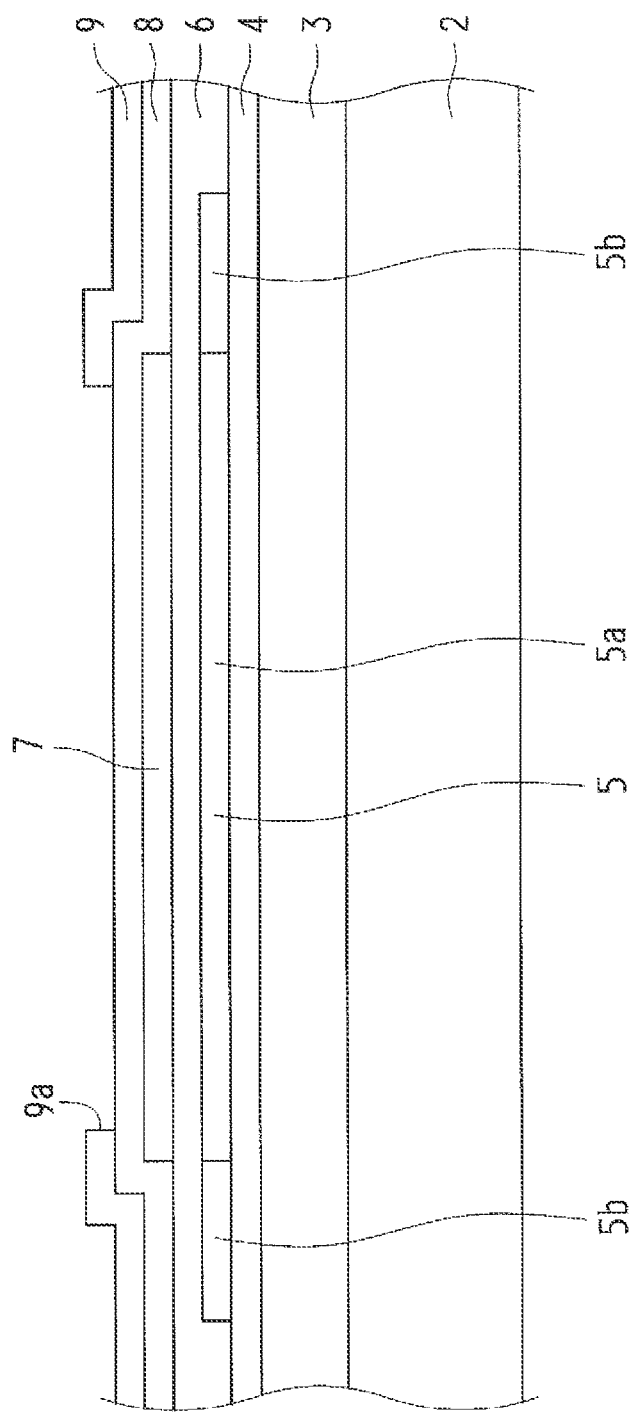
FIG. 23A is a schematic cross-sectional view illustrating a cross section along a channel region of the drive transistor in the capacitance electrode forming step.
Figure 23B:
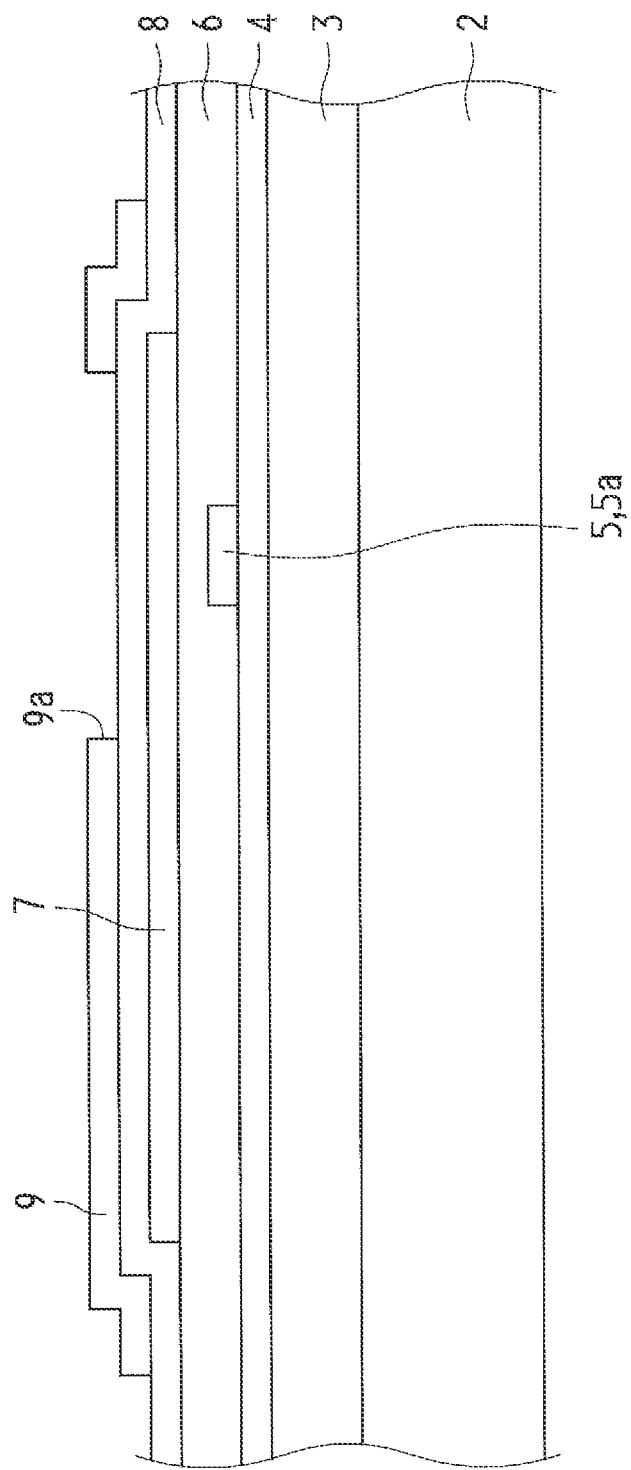
FIG. 23B is a schematic cross-sectional view illustrating a cross section passing through a first opening of the drive transistor in the capacitance electrode forming step.

FIG. 22 is a schematic plan view illustrating the drive transistor in the capacitance electrode forming step, FIG. 23A is a schematic cross-sectional view illustrating a cross section along the channel region of the drive transistor in the capacitance electrode forming step, and FIG. 23B is a schematic cross-sectional view illustrating a cross section passing through the first opening of the drive transistor in the capacitance electrode forming step. In other words, FIG. 23A corresponds to a cross section of the same location as arrow A-A in FIG. 20, and FIG. 23B corresponds to a cross section of the same location as arrow B-B in FIG. 20.

In the second embodiment, the capacitance electrode 9 differs from the first embodiment (particularly, the third modified example) in that only the widely formed first opening 9a is included and the second opening 9b is not provided. Note that the first opening 9a of the capacitance electrode 9 illustrated in FIG. 22 is connected to the second opening 9b in the first embodiment, and is further widened.

Figure 24:
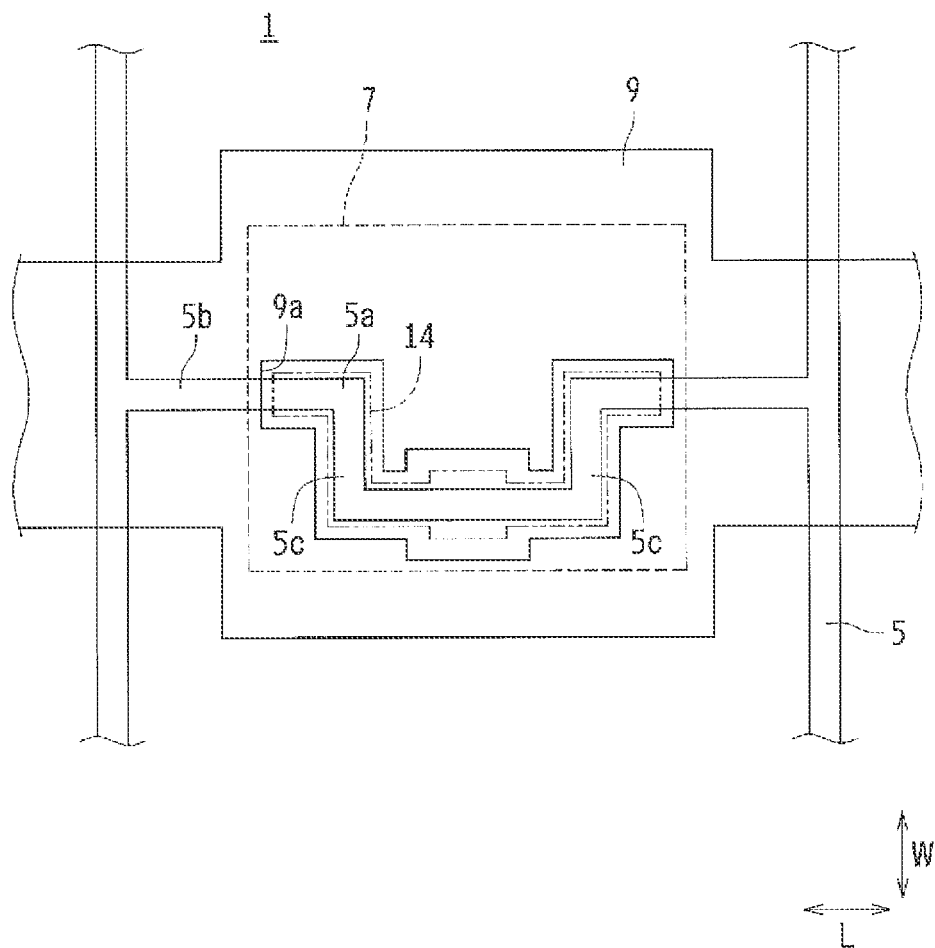
FIG. 24 is a schematic plan view illustrating the drive transistor in an annealing step.
Figure 25A:
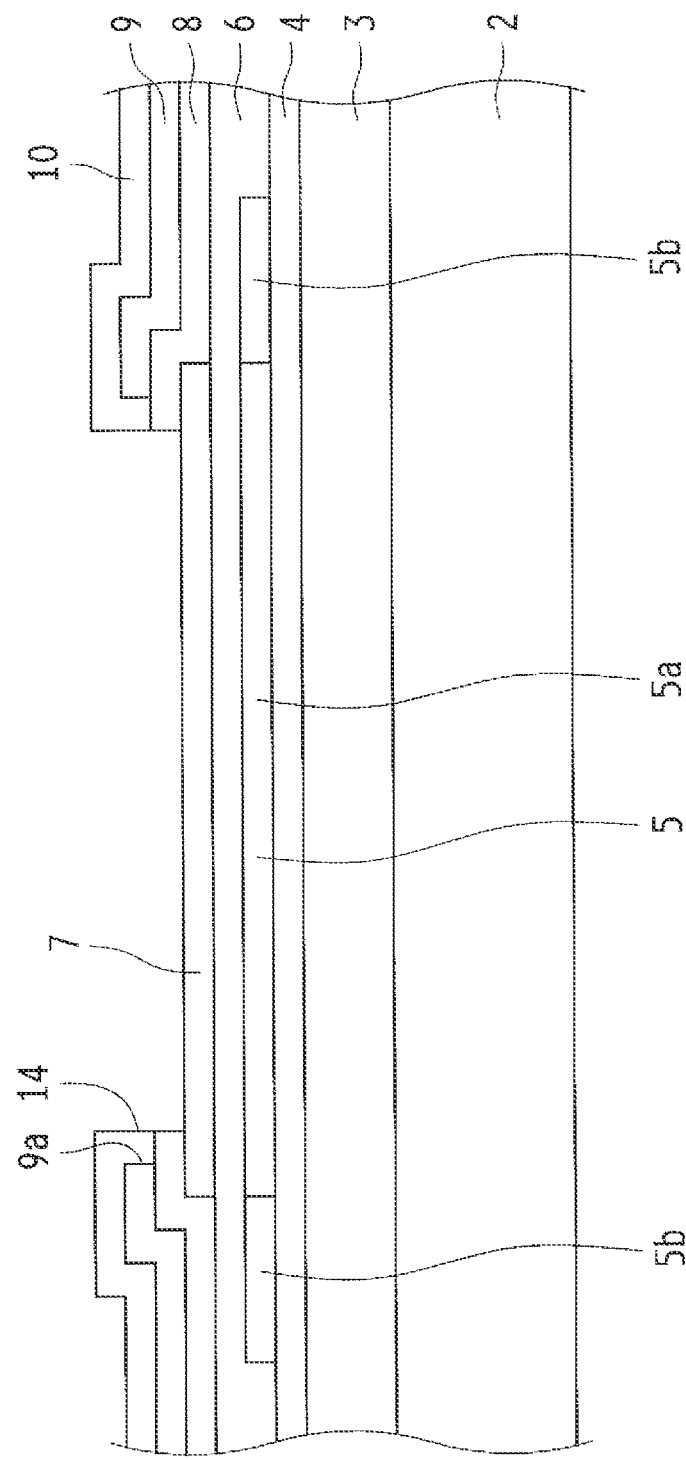
FIG. 25A is a schematic cross-sectional view illustrating a cross section along the channel region of the drive transistor in the annealing step.
Figure 25B:
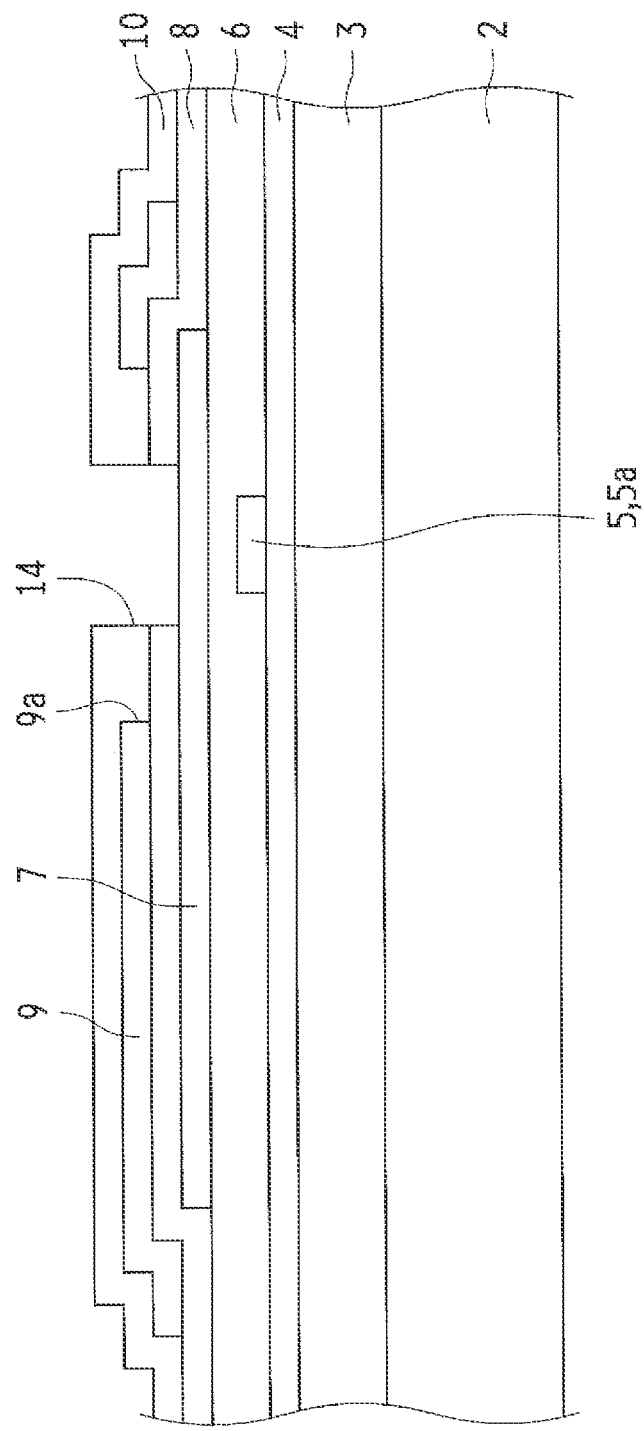
FIG. 25B is a schematic cross-sectional view illustrating a cross section passing through the first opening of the drive transistor in the annealing step.

FIG. 24 is a schematic plan view illustrating the drive transistor in the annealing step, FIG. 25A is a schematic cross-sectional view illustrating a cross section along the channel region of the drive transistor in the annealing step, and FIG. 25B is a schematic cross-sectional view illustrating a cross section passing through the first opening of the drive transistor in the annealing step. In other words, FIG. 25A corresponds to a cross section of the same location as arrow A-A in FIG. 20, and FIG. 25B corresponds to a cross section of the same location as arrow B-B in FIG. 20.

In the second embodiment, similar to the first embodiment, after the capacitance electrode forming step illustrated in FIG. 22, the second interlayer insulating film 10 is layered on the entire surface of the substrate 2, and the first interlayer insulating film 8 and the second interlayer insulating film 10 are patterned to form the contact hole 14. In the present embodiment, the contact hole 14 may be slightly smaller than the first opening 9a or may have a shape different from that of the first opening 9a as long as the contact hole 14 falls inside the first opening 9a. In other words, it is sufficient that the contact hole 14 be provided so as to expose a wider range than a portion of the gate electrode 7 connected to the connection wiring line 11, and the degree of the desorption of hydrogen due to annealing changes depending on the width of the contact hole 14.

Figure 26A:
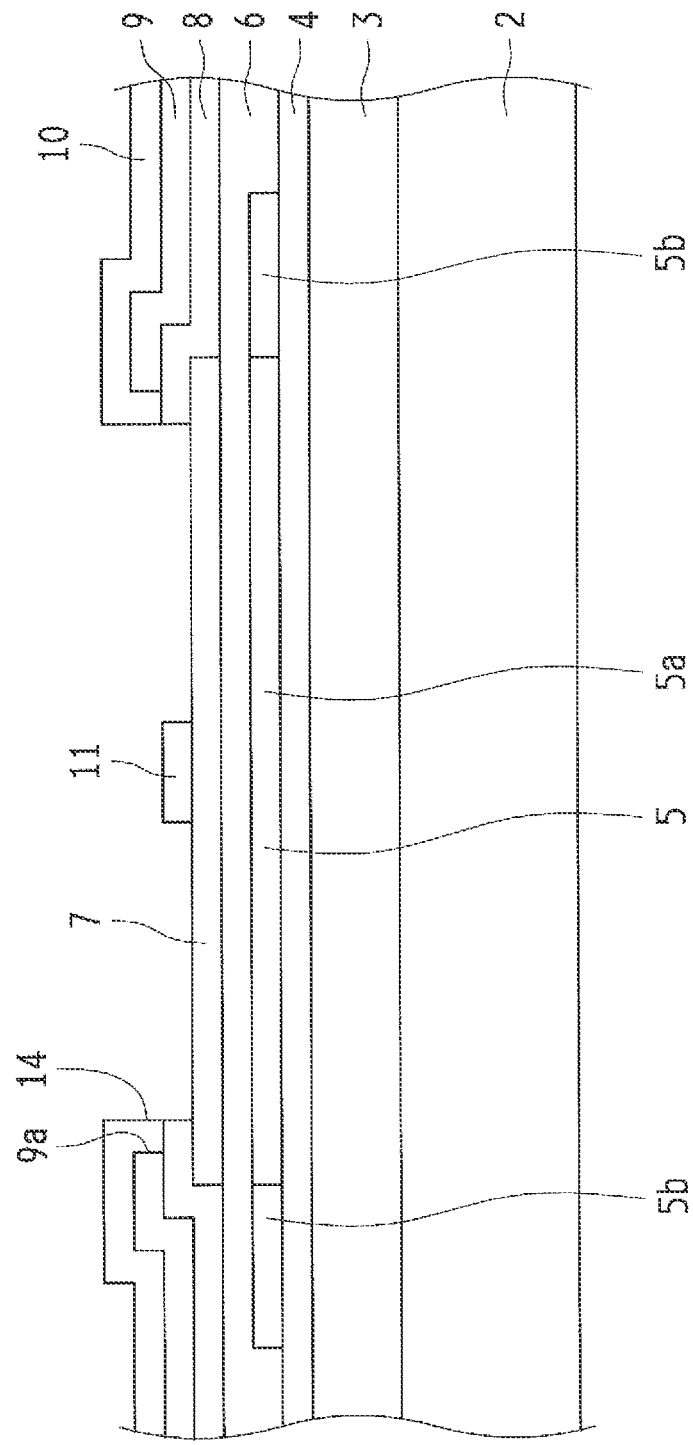
FIG. 26A is a schematic cross-sectional view illustrating a cross section along the channel region of the drive transistor in a connection wiring line forming step.
Figure 26B:
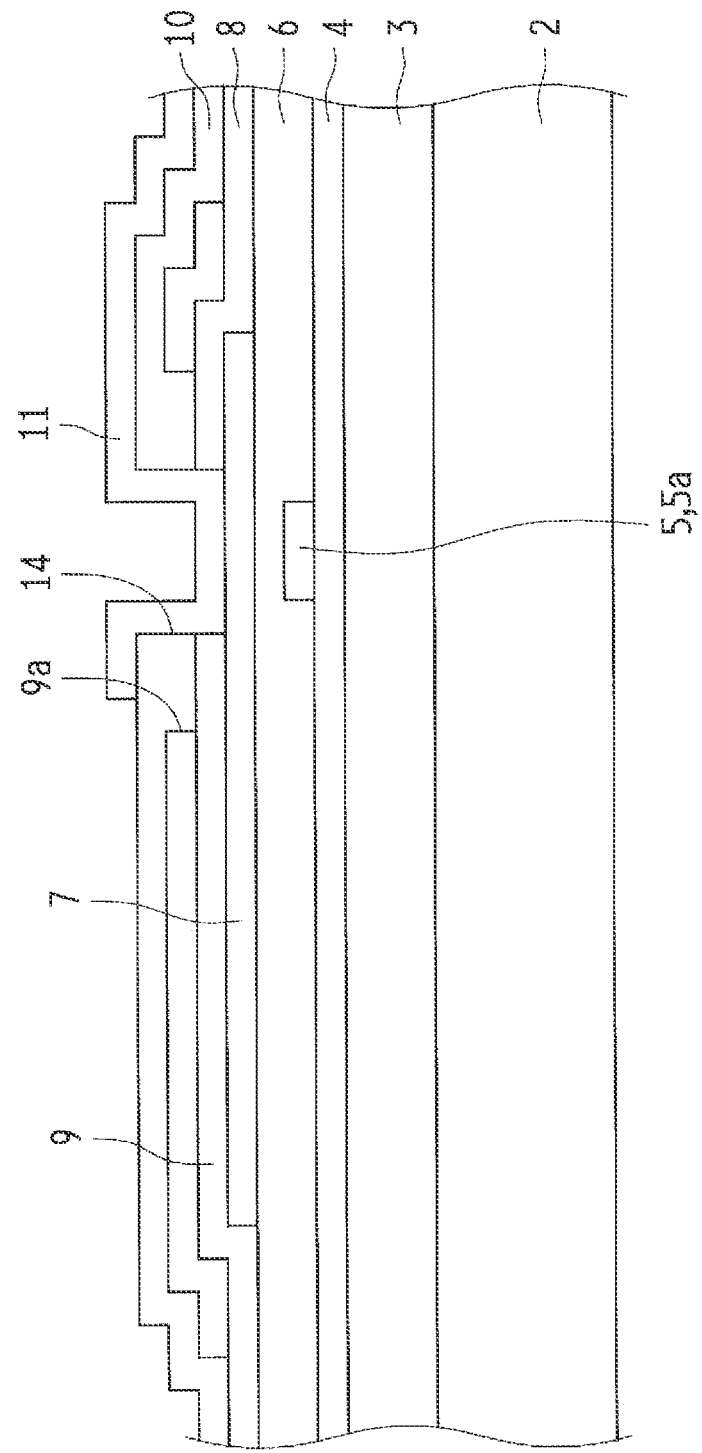
FIG. 26B is a schematic cross-sectional view illustrating a cross section passing through the first opening of the drive transistor in the connection wiring line forming step.

FIG. 26A is a schematic cross-sectional view illustrating a cross section along the channel region of the drive transistor in the connection wiring line forming step, and FIG. 26B is a schematic cross-sectional view illustrating a cross section passing through the first opening of the drive transistor in the connection wiring line forming step.

Similar to the first embodiment, after the annealing step, the connection wiring line 11 is formed by patterning the third metal layer that is layered on the entire surface of the substrate 2. The connection wiring line 11 may be connected to the gate electrode 7 anywhere as long as it is inside the contact hole 14, and may be adjusted as appropriate in accordance with a shape of the connection wiring line 11.

Next, a structure in the vicinity of a display region of the display device will be described with reference to the drawings.

Figure 27:
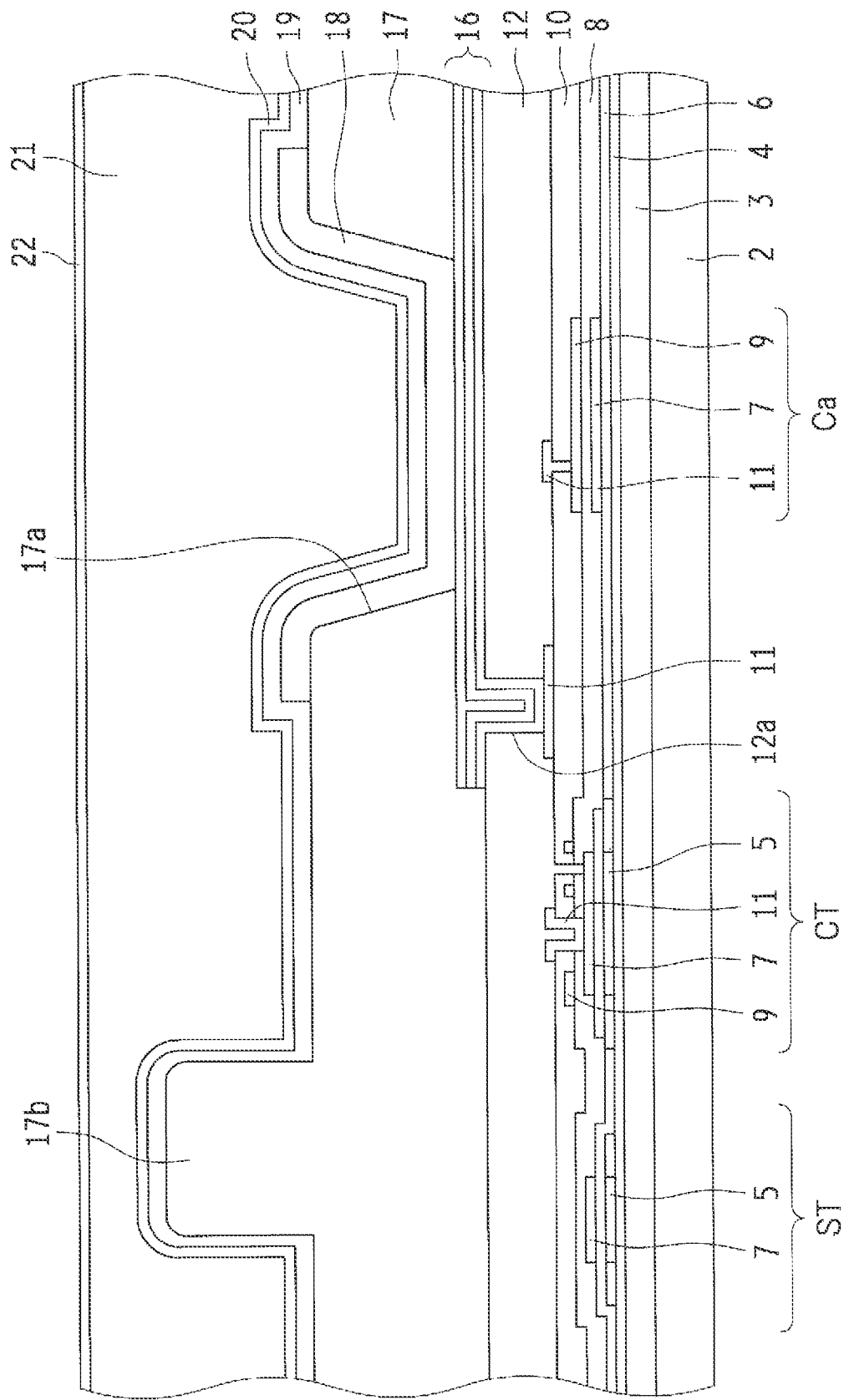
FIG. 27 is a schematic cross-sectional view schematically illustrating a cross section in the vicinity of a display region.

FIG. 27 is a schematic cross-sectional view schematically illustrating a cross section in the vicinity of the display region.

As described above, in the display device, the flexible substrate 3, the base coat layer 4, the semiconductor layer 5, the gate insulating film 6, the gate electrode 7, the first interlayer insulating film 8, the capacitance electrode 9, the second interlayer insulating film 10, the connection wiring line 11, the flattening film 12, and the like are layered on the substrate 2 to form a first transistor CT (corresponding to the drive transistor 1 described above). A second transistor ST and a capacitor Ca may be formed on the substrate 2 as well as the first transistor CT.

The second transistor ST is configured to include the semiconductor layer 5 and the gate electrode 7 facing each other with the gate insulating film 6 interposed therebetween. The entire surface of the gate electrode 7 of the second transistor ST is covered with the first interlayer insulating film 8 and the second interlayer insulating film 10. In other words, unlike the first transistor CT, the contact hole 14 and the hole 15 for promoting the desorption of hydrogen are not provided, so that a switching transistor having a small S value is configured.

The capacitor Ca is configured to include the gate electrode 7 and the capacitance electrode 9 facing each other with the first interlayer insulating film 8 interposed therebetween, and functions as a capacitor in the pixel circuit.

The first transistor CT, the second transistor ST, and the capacitor Ca can be formed together on the substrate 2, and shapes to be shaped may be appropriately adjusted in the patterning of the semiconductor layer 5, the gate electrode 7, the first interlayer insulating film 8, the capacitance electrode 9, the second interlayer insulating film 10, and the connection wiring line 11.

In the display device, a reflective electrode 16, an edge cover 17, an organic EL layer 18, an upper electrode 19, a first TFE inorganic film 20, an organic film 21, and a second TFE inorganic film 22 are further layered on the flattening film 12.

The connection wiring line 11 is also provided in a portion other than the first transistor CT, the second transistor ST, and the capacitor Ca, and a connection opening 12a is provided in the flattening film 12 corresponding to the connection wiring line 11.

The reflective electrode 16 is connected to the connection wiring line 11 via the connection opening 12a. Note that the reflective electrode 16 has a layered structure including an electrode sandwiched between ITO films. In the structure illustrated in FIG. 27, the reflective electrode 16 is provided in a region overlapping with the capacitor Ca and is not provided immediately above the first transistor CT and the second transistor ST.

The edge cover 17 is provided with an edge opening 17a provided corresponding to the reflective electrode 16, and a thick film portion 17b having a thickness greater than that of the periphery.

The organic EL layer 18 is provided in a region corresponding to the edge opening 17a, and is connected to the reflective electrode 16 via the edge opening 17a. The organic EL layer 18 functions as a light-emitting element in the pixel circuit, the reflective electrode 16 corresponds to an anode electrode of the light-emitting element, and the upper electrode 19 corresponds to a cathode electrode of the light-emitting element.

Note that FIG. 27 only illustrates a portion of the display device, and the display device may be further provided with other elements such as transistors and light-emitting elements in the display device. The semiconductor layer 5, the gate electrode 7, the capacitance electrode 9, the connection wiring line 11, and the like may be appropriately extended and connected to other elements.

Figure 28:
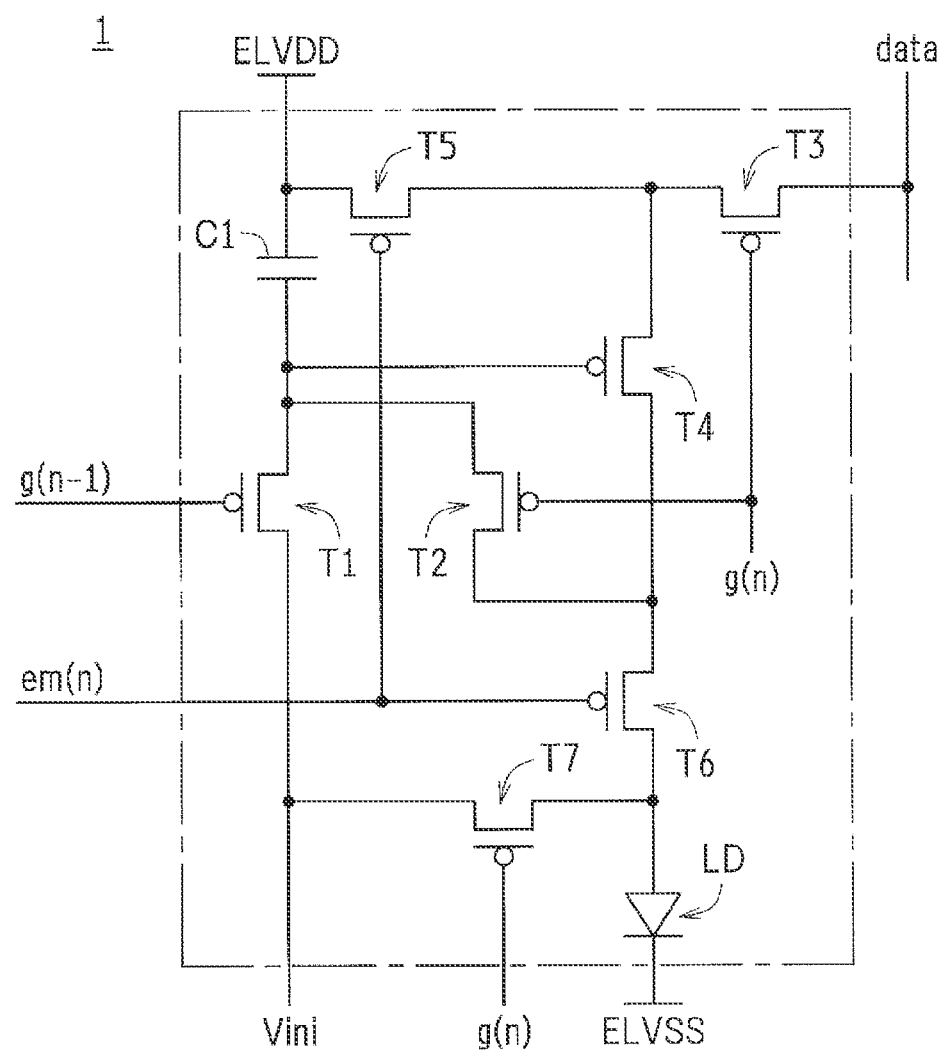
FIG. 28 is an equivalent circuit diagram illustrating a pixel circuit of a display device.

FIG. 28 is an equivalent circuit diagram illustrating the pixel circuit of the display device.

The display device includes a display region configured of a plurality of pixels arrayed in a matrix. The plurality of pixels typically includes red pixels that display red, green pixels that display green, and blue pixels that display blue. In each pixel, a corresponding light emitting diode LD is provided, and is controlled by a corresponding pixel circuit.

A straight line corresponding to "Data" indicates a data signal line, and a straight line corresponding to "em (n)" indicates a light emission control line. "ELVDD" indicates a high power supply voltage, and a straight line connected to this correspond to a high power supply voltage line. "ELVSS" indicates a low power supply voltage, and a straight line connected to this correspond to a low power supply voltage line. Straight lines corresponding to "G (n)" and "G (n−1)" indicate gate signal lines, and a straight line corresponding to "Vini" indicates an initialization wiring line corresponding to a reset potential.

In the present embodiment, 5 V is applied to the high power supply voltage lines, and −5 V is applied to the low power supply voltage lines. 2 to 6 V is applied to the data signal line. −4 V is applied to the initialization wiring line. To the scanning signal line and the light emission control line, 7 V is applied in a state of being "High", and −8 V is applied in a state of being "Low".

FIG. 28 illustrates an example of the pixel circuit, and is configured by combining seven transistors (from a first circuit transistor T1 to a seventh circuit transistor T7), a capacitor C1, and the light emitting diode LD.

In the pixel circuit, the first circuit transistor T1 to a third circuit transistor T3, and a fifth circuit transistor T5 to the seventh circuit transistor T7 are used as switching transistors. A fourth circuit transistor T4 is configured to be a drive transistor that supplies power to the light emitting diode LD.

The first circuit transistor T1 is configured to be an initialization transistor, one end is connected to a gate electrode of a drive transistor (a fourth circuit transistor T4), and the other end is connected to the initialization wiring line. The seventh circuit transistor T7 is configured to be an initialization transistor, one end is connected to the anode of the light emitting diode LD, and the other end is connected to the initialization wiring line.

The display device according to the present embodiment is not particularly limited as long as the display device is a display panel including display elements. Examples of the display elements include display elements having luminance or transmittance controlled by current and display elements having luminance or transmittance controlled by voltage. Examples of the display elements controlled by current include organic Electro Luminescent (EL) displays equipped with Organic Light Emitting Diodes (OLED), EL displays such as inorganic EL displays equipped with inorganic light emitting diodes, Quantum dot Light Emitting Diode (QLED) displays equipped with QLEDs, and the like. Examples of a voltage control display element include a liquid crystal display element and the like.

Note that the presently disclosed embodiments are illustrative in all respects, and do not become a basis of limited interpretation. Accordingly, the technical scope of the disclosure is not to be interpreted only by the above-described embodiments, but is defined based on the description of the claims. In addition, all modifications within the meaning and scope equivalence to the scope of the claims are included.

The invention claimed is:

1. A display device including a plurality of pixels and pixel circuits corresponding to the plurality of pixels, the display device comprising:
    a substrate;
    a semiconductor layer;
    a gate insulating film;
    a gate electrode;
    a first interlayer insulating film;
    a capacitance electrode; and
    a second interlayer insulating film, the semiconductor layer, the gate insulating film, the gate electrode, the first interlayer insulating film, the capacitance electrode, and the second interlayer insulating film being sequentially layered on the substrate,
    wherein each of the pixel circuits includes a drive transistor, a capacitor, and a connection wiring line,
    the drive transistor includes the semiconductor layer, the gate insulating film, and the gate electrode overlapping with each other in a plane view, the capacitor includes the gate electrode, the first interlayer insulating film, and the capacitance electrode overlapping with each other in the plane view, the semiconductor layer is provided with a channel region and conductor regions sandwiching the channel region therebetween, the capacitance electrode is provided with a first opening in a portion of a position overlapping with the gate electrode in the plane view, the first interlayer insulating film and the second interlayer insulating film include a contact hole provided at a position surrounded by the first opening, the connection wiring line is provided on the second interlayer insulating film and is connected to the gate electrode via the contact hole, the contact hole overlaps with a portion of the channel region in the plane view, the contact hole is provided to intersect at least one end of the channel region in a channel width direction orthogonal to a channel length direction in which the conductor regions face each other, the contact hole is extended in the channel length direction along the channel region, the channel region includes a serpentine portion extended in a direction intersecting the channel length direction, and the contact hole is further extended along the serpentine portion.

2. The display device according to claim 1, wherein a range in which the first opening is provided is within a range overlapping with the gate electrode.

3. The display device according to claim 1, wherein the capacitance electrode is a first power supply voltage line common to the plurality of pixels.

4. The display device according to claim 1, wherein the contact hole is provided to intersect both ends of the channel region in the channel width direction.

* * * * *